(12) United States Patent
Sugimori

(10) Patent No.: US 7,576,367 B2
(45) Date of Patent: Aug. 18, 2009

(54) HIGH-EFFICIENCY, OVERVOLTAGE-PROTECTED, LIGHT-EMITTING SEMICONDUCTOR DEVICE

(75) Inventor: Nobuhisa Sugimori, Niiza (JP)

(73) Assignee: Sanken Electric Co., Ltd. (JP)

( * ) Notice: Subject to any disclaimer, the term of this patent is extended or adjusted under 35 U.S.C. 154(b) by 39 days.

(21) Appl. No.: 11/746,894

(22) Filed: May 10, 2007

(65) Prior Publication Data

US 2007/0284606 A1 Dec. 13, 2007

(30) Foreign Application Priority Data

May 17, 2006 (JP) .............................. 2006-138303

(51) Int. Cl.
*H01L 27/15* (2006.01)
(52) U.S. Cl. ................................. 257/99; 257/E33.065
(58) Field of Classification Search .................... 257/99
See application file for complete search history.

(56) References Cited

U.S. PATENT DOCUMENTS

| 5,698,865 | A  | * | 12/1997 | Gerner et al. | .................. | 257/94 |
| 5,744,828 | A  | * | 4/1998  | Nozaki et al. | .................. | 257/94 |
| 6,885,036 | B2 | * | 4/2005  | Tarsa et al.  | ..................... | 257/99 |
| 7,173,311 | B2 | * | 2/2007  | Sato et al.   | .................... | 257/355 |
| 2005/0168899 | A1 | * | 8/2005 | Sato et al. | .................. | 361/91.1 |

FOREIGN PATENT DOCUMENTS

| JP | 2001-237461 A | 8/2001 |
| JP | 2006-066863 A | 3/2006 |

* cited by examiner

*Primary Examiner*—Sue Purvis
*Assistant Examiner*—Benjamin P Sandvik
(74) *Attorney, Agent, or Firm*—Woodcock Washburn LLP

(57) ABSTRACT

An LED comprises a multilayered light-generating semiconductor region grown on one of a pair of opposite major surfaces of a semiconducting silicon substrate, a bonding pad overlying the light-generating semiconductor region and received in part in a cavity formed centrally therein, and a substrate electrode on the other major surface of the substrate. For protecting the LED from voltage spikes or like transients, an overvoltage protector such as a Schottky barrier diode is interposed between the bonding pad and the substrate. Further, for a uniform current distribution throughout the light-generating semiconductor region, a current-spreading film of electrically conducting, optically transparent material overlies the light-generating semiconductor region and itself covered by a transparent overlay of electrically insulating material. The bonding pad is electrically coupled to the current-spreading film via a plurality of connector strips extending radially from the pad over the transparent overlay. The connector strips have ribs depending therefrom and extending through radial slits in the transparent overlay into electrical contact with the current-spreading film.

16 Claims, 15 Drawing Sheets

HIGH-EFFICIENCY, OVERVOLTAGE-PROTECTED, LIGHT-EMITTING SEMICONDUCTOR DEVICE

CROSS REFERENCE TO RELATED APPLICATIONS

This application claims priority to Japanese Patent Application No. 2006-138303, filed May 17, 2006.

BACKGROUND OF THE INVENTION

This invention relates to light-emitting semiconductor devices, or light-emitting diodes (LEDs) according to common parlance, and particularly to those monolithically integrated with an overvoltage protector. More particularly, the invention concerns how to improve the light-emitting efficiency of such overvoltage-protected light-emitting semiconductor devices. Overvoltage protectors that can be integrated with light-emitting semiconductor devices according to the invention include, but are not limited to, the Schottky barrier diode, pn-junction diode, varistor, and capacitor.

Japanese Unexamined Patent Publication No. 2000-66863, filed by the assignee of the instant invention, suggests an overvoltage-protected LED of particular pertinence to the present application. It comprises a light-generating semiconductor region of nitride layers on a semiconducting silicon substrate, a current-spreading film of transparent, electrically conducting material on the light-emitting surface of the light-generating semiconductor region, a wire-bonding pad placed centrally on the current-spreading film, a substrate electrode on the underside of the substrate, and an overvoltage protector in or on the substrate. Compactly disposed under the bonding pad, the overvoltage protector hardly adds to the size of the LED.

In the LED of the foregoing known construction, were it not for the current-spreading film under the bonding pad, the current would flow only through that part of the light-generating semiconductor region which lies right under the bonding pad. Covering the entire light-emitting surface of the light-generating semiconductor region, the current-spreading film serves to spread the current flow throughout the light-generating semiconductor region, including its peripheral part away from the bonding pad, and so to cause light emission with a constant intensity from its complete light-emitting surface. The current-spreading film should therefore be as low in electric resistance, and as high in optical transparency, as practical. The material generally favored as meeting these requirements is indium tin oxide (ITO or tin-doped indium oxide), a mixture of, typically, 90 percent indium oxide and 10 percent tin oxide by weight. ITO has its own shortcomings, however.

First of all, ITO is higher in resistivity than metal. It is not totally transparent, moreover, so it had to be fabricated in as thin a film as feasible. Consequently, the ITO film was not sufficiently low in sheet resistance to assure an unvarying current density throughout the light-generating semiconductor region. As far as the applicant is aware, there are no known materials today that are better in both conductivity and transparency than ITO for the current-spreading film.

A solution to this problem is found in Japanese Unexamined Patent Publication No. 2001-237461, which teaches to electrically connect the bonding pad to the current-spreading film via a filamentary connector of radial or latticed pattern on the film. Made from one or more selected metals or alloys, the filamentary connector is less in resistivity, and greater in thickness, than the ITO film. The filamentary connector is therefore capable of better distributing the current flow throughout the light-generating semiconductor region, realizing light emission with a higher efficiency and with a constant intensity from the entire light-emitting surface of the device.

The instant applicant devised a set of connector strips which by themselves are similar to the filamentary connector above, for use in an overvoltage-protected LED. When these connector strips were incorporated in the prior art overvoltage-protected LED referred to earlier herein, the resulting device (shown in FIG. 1 of the drawings attached hereto) proved to possess a serious shortcoming: The connector strips were liable to breakage during its fabrication. This shortcoming had to be overcome by any means in order for the device to win true utility and commercial value.

SUMMARY OF THE INVENTION

The present invention has it as a general object to improve the light-emitting efficiency of an overvoltage-protected light-emitting semiconductor device of the kind defined.

A more specific object of the invention is to assure a constant distribution of current flow throughout the light-generating semiconductor region of the device, and hence light emission with a constant intensity from the entire light-emitting surface of the device, without the problem pointed out above and to be detailed below.

Briefly, the invention may be summarized as a high-efficiency, overvoltage-protected light-emitting semiconductor device comprising a light-generating semiconductor region formed on a substrate of electroconductive material for generating light to be emitted, the light-generating semiconductor region having a first surface (light-emitting surface) facing away from the substrate and a second surface held against the substrate. A bonding pad is placed on a part of the first surface of the light-generating semiconductor region and a cavity of the light-generating semiconductor region. A substrate electrode is formed in a prescribed position on the substrate. Electrically coupled to both of the bonding pad and the substrate electrode, an overvoltage protector is disposed between the bonding pad and the second surface of the substrate. A current-spreading film of electrically conducting, optically transparent material is disposed on the first surface of the light-generating semiconductor region. A transparent overlay of electrically insulating material covers the current-spreading film and is partly placed between the bonding pad and the first surface of the light-generating semiconductor region. The bonding pad is electrically coupled to the current-spreading film via connector means overlying the transparent overlay. The connector means include parts received in slit in the transparent overlay into contact with the current-spreading film. A current from the bonding pad is made to flow uniformly throughout the light-generating semiconductor region via the connector means and the current-spreading film.

In a preferred embodiment the connector means take the form of a plurality of connector strips each coupled at one end to the bonding pad and all extending radially over the transparent overlay. Each connector is received in part in one slit in the transparent overlay into electrical contact with the current spreading film. Typically, each connector strip is T-shaped in cross section, comprising a strip section overlying the transparent overlay and a rib section depending from the strip section and received in one slit in the transparent overlay into contact with the current-spreading film.

The invention as summarized above offers the following advantages over the prior art:

1. Extending over the transparent overlay, the connector strips are ribbed for contact with the current-spreading film via the narrower slits in the transparent overlay. The connector strips are therefore far less likely to break than their conventional counterparts.

2. The connector strips are made from a material that is less in resistivity than that of the current-spreading film. A more constant distribution throughout the light-generating semiconductor region is thus realized than in the absence of the connector strips, the current-spreading film being made as aforesaid from the irreplaceable ITO.

3. The transparent overlay of electrically insulating material not only covers the current-spreading film but is partly placed between the bonding pad and the first surface of the light-generating semiconductor region. The transparent overlay thus performs the additional function of cushioning the stresses that might be exerted by the bonding pad on the light-generating semiconductor region.

4. Compactly installed between bonding pad and the second surface of the substrate, the overvoltage protector hardly adds to the size of the device. Nor does it interfere in any way with current flow from the bonding pad to the current-spreading film through the improved connector means of this invention.

The above and other objects, features and advantages of this invention will become more apparent, and the invention itself will best be understood, from a study of the following description and appended claims, with reference had to the attached drawings showing some preferable embodiments of the invention.

DETAILED DESCRIPTION

Figure 1:
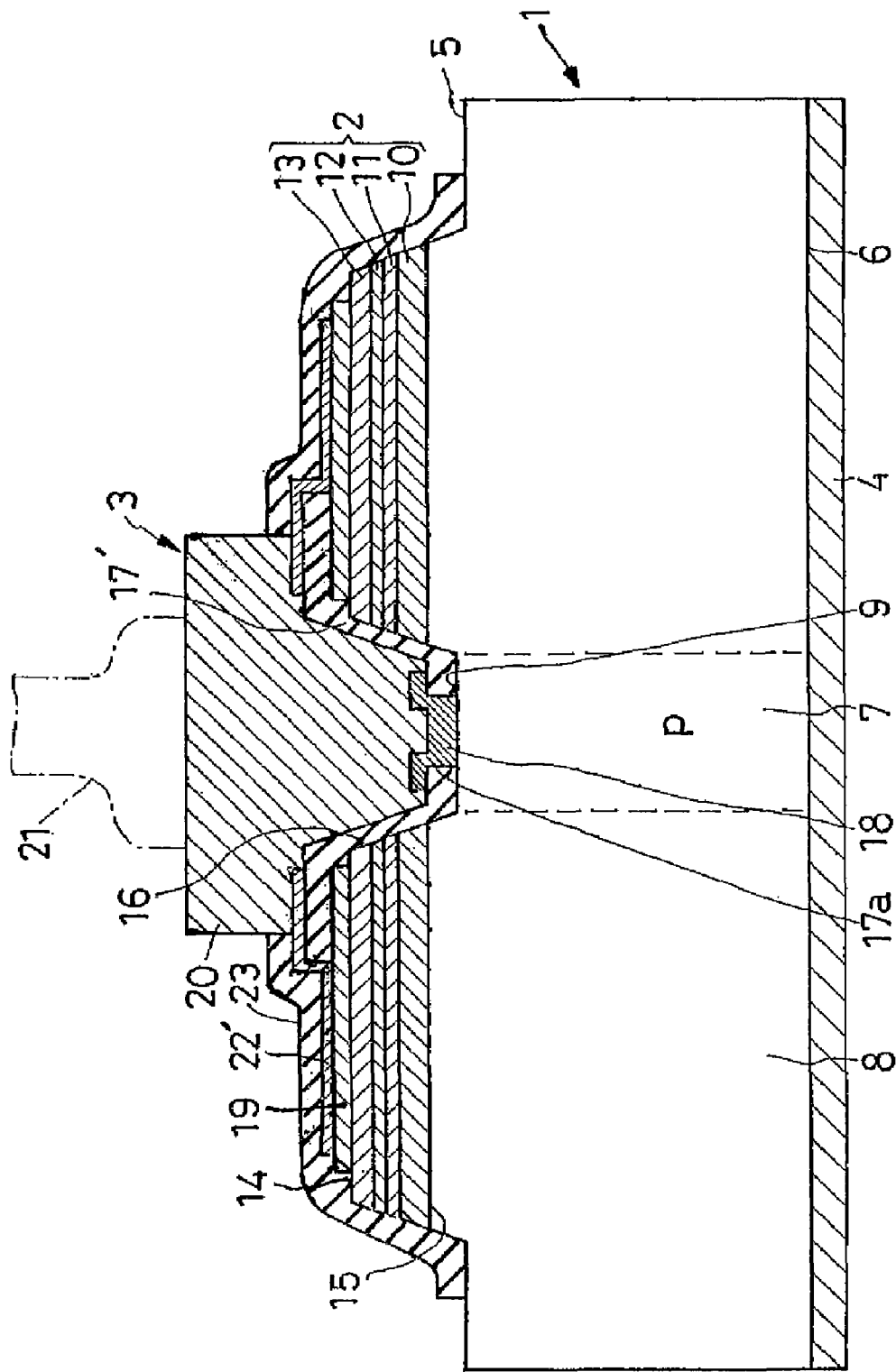
FIG. 1 is a diagrammatic sectional illustration of the prior art overvoltage-protected LED incorporating the connector strips similar to those of the instant invention.

It is considered essential that the closest prior art be shown and described in some more detail, the better to make clear the features and advantages of this invention. The prior art device shown in FIG. 1 represents a simple combination of the known overvoltage-protected LED according to Japanese Unexamined Patent Publication No. 2006-66863, supra, and the noted set of connector strips devised by this applicant in substitution for the conventional filamentary connector according to Japanese Unexamined Patent Publication No. 2001-237461, supra.

The prior art device broadly comprises a monocrystalline p-type silicon substrate 1, a light-generating semiconductor region 2 of Groups III-V compound semiconductor materials, front electrode means 3, and a back or substrate electrode 4.

For convenience of description the substrate 1 may be thought of as comprising a core section 7 and, around it, an annular or tubular outer section 8, with the border therebetween being indicated by the broken lines. The core section 7 of the substrate 1 works mostly as a part of the overvoltage protector which takes the form of a Schottky barrier diode yet to be described. The outer section 8 mechanically supports the light-generating semiconductor region 2 thereon.

Formed on the substrate 1 via an n-type buffer layer 10, the light-generating semiconductor region 2 is shown configured to provide the primary working parts of a double heterojunction LED. The primary working parts of the LED are an n-type semiconductor layer or lower cladding 11, an active layer 12, and a p-type semiconductor layer or upper cladding 13. Formed centrally through the light-generating semiconductor region 2 is a cavity 16 which tapers as it extends from top 14 to bottom 15 of the region 2.

The substrate 1 has a recess 9 defined in its top surface 5 in register with the tapering cavity 16 in the light-generating semiconductor region 2. The recess 9 accommodates a metal-made Schottky electrode 18 for providing the Schottky barrier diode in combination with the core section 7 of the substrate 1 by way of an overvoltage protector.

The front electrode means 3 is comprised of a current-spreading film 19 of ITO, a wire-bonding pad 20, and a set of connector strips 22'. The current-spreading film 19 overlies most of the top surface 14 of the light-generating semiconductor region 2. The bonding pad 20 fills the cavity 16 in the light-generating semiconductor region 2 and further covers an annular central part of this region 2. The bonding pad 20 is electrically coupled to the current-spreading film 19 via the connector strips 22' and directly to the Schottky electrode 18.

An inside insulating film 17' covers the surfaces bounding the recess 9 in the substrate 1 and the tapering cavity 16 in the light-generating semiconductor region 2, as well as the annular central part of this region 2. A hole $17_a$ is formed in the inside insulating film 17' to permit the Schottky electrode 18 to make Schottky contact with the substrate 1. The inside insulating film 17' performs the dual function of electrically isolating the bonding pad 20 from both substrate 1 and light-generating semiconductor region 2 and of mitigating the stress that might be exerted by the bonding pad 20 on the light-generating semiconductor region 2. Should the bonding pad be placed in contact with the light-generating semiconductor region 2 either directly or via the current-spreading film 19 and connector strips 22', that is, were it not for the inside insulating film 17', then the light-generating semiconductor region would be strained so much as to suffer substantive deteriorations of optical as well as mechanical characteristics. Placed all under the bonding pad 20, the inside insulating film 17' serves to mitigate the stress that may be applied from the bonding pad to the light-generating semiconductor region 2.

The connector strips 22' extend from under the bonding pad 20 outwardly over the current-spreading film 19. These connector strips 22' are made by deposition, and subsequent etching, of a metal that is lower in resistivity than ITO. Like the filamentary connector of radial or latticed arrangement suggested by Japanese Unexamined Patent Publication No. 2001-237461 above, the connector strips 22' cover only narrowly limited parts of the current-spreading film 19 and coact therewith to assure a uniform current flow throughout the light-generating semiconductor region 2.

The provision of the connector strips 22' necessitates the provision of an outside insulating film 23 aside from the inside insulating film 17'. Made from a transparent material, the outside insulating film 23 covers the side of the light-generating semiconductor region 2 and the outer part of the surface of the current-spreading film 19 as well as parts of the connector strips 22' thereon by way of protection.

The substrate electrode 4 on the underside of the substrate 1 serves both as cathode of the LED and as anode of the Schottky barrier diode. The front electrode means 3 including the bonding pad 20, on the other hand, serve both as anode of the LED and as cathode of the Schottky barrier diode.

Thus, upon application of a forward voltage between bonding pad 20 and substrate electrode 4, the light-generating semiconductor region 2 will produce light for emission through the current-spreading film 19 and outside insulating film 23. The Schottky barrier diode will conduct when a reverse voltage is applied to the LED due for example to static electricity. The LED will be protected from overvoltage as its reverse voltage is limited to the forward voltage of the diode. Underlying the bonding pad 20, the diode hardly adds to the size of the LED.

A problem with this prior art LED arises from the bends created in the connector strips 22' by the outer edge of the inside insulating film 17' which is designed as aforesaid to save the light-generating semiconductor region 2 from being stressed by the bonding pad 20. Extending from under the bonding pad 20 over the inside insulating film 17' into direct engagement with the current-spreading film 19, each connector strip 22' is right-angularly bent twice, so to speak, although this statement might be overly true to the diagrammatic showing of FIG. 1. It should nevertheless be taken into consideration that the connector strips 22' must be made as slender as possible for minimal interference with the light being emitted through the current-spreading film 19. Such slender connector strips are all the more vulnerable to breakage as they are created by deposition over the outer edge of the inside insulating film 17'. The connector strips on breakage make it impossible to uniformly distribute the current flow throughout the light-generating semiconductor region 2. Without the inside insulating film 17', of course, this risk would disappear. But the inside insulating film 17' is not eliminable because of the noted important functions for which it is intended.

Embodiment of FIGS. 2-8

Such vulnerability of the connector strips is thoroughly overcome in the improved overvoltage-protected, high-efficiency light-emitting semiconductor device according to this invention. The improved device of the invention will now be described in detail in terms of its first preferred form illustrated in FIGS. 2-8. This first preferred form differs from the prior art device of FIG. 1 only in its transparent overlay 17 of electrically insulating material and connector strips 22. The transparent overlay 17 corresponds to a combination of the inside insulating film 17' and outside insulating film 23 of the prior art device, and the connector strips 22 to the connector strips 22' of the prior art.

The first preferred form is therefore similar to the FIG. 1 device in comprising the substrate 1, light-generating semiconductor region or main semiconductor region 2, front electrode means 3, back or substrate electrode 4, Schottky electrode 18, and current-spreading film 19. All these preexisting components of the overvoltage-protected LED will be explained in detail below before proceeding to the detailed description of the transparent overlay 17 and connector strips 22.

The substrate 1 is made from monocrystalline silicon doped with boron or like Group III element into p type. Generally flat in shape, the substrate 1 has a pair of opposite major surfaces 5 and 6, with the light-generating semiconductor region 2 and front electrode means 3 formed on the first major surface 5 and the back electrode 4 on the second major surface 6. The substrate 1 has a p-type impurity concentration of $5\times10^{18}$-$5\times10^{19}$ cm$^{-3}$ and a resistivity of 0.0001-0.0100 ohm-centimeters.

The substrate 1 is therefore electrically conductive, providing current paths for both LED and overvoltage protector. It is the core section 7 of the substrate 1 that provides the current path for the Schottky barrier diode, besides serving as a major part of the diode. The tubular outer section 8 of the substrate provides the current path for the LED. Additionally, the substrate 1 serves both as a basis on which is epitaxially grown the light-generating semiconductor region 2 and as a mechanical support for this region 2 and the electrodes 3 and 4. In order to well serve all these purposes the substrate 1 may be made as thick as 100-500 micrometers.

Although the substrate 1 is shown to have its top surface 5 peripherally recessed and centrally depressed at 9, these are not essential features of the substrate; instead, the entire top surface 5 of the substrate could be flat. Further the substrate could be of n type, instead of p type as set forth above. Additionally, as required or desired, the impurity concentration of the substrate 1 may be made higher in its outer section 8 than in its core section 7. With the outer section 8 thus made less in resistivity than the core section 7, a less voltage drop will occur in the outer section 8 during operation of the LED.

Grown by epitaxy on the outer section 8 of the substrate 1 is the light-generating semiconductor region 2 providing the primary working parts of a double heterojunction LED. The compositions of the n-type buffer layer 10, n-type lower cladding or n-type semiconductor layer 11, active layer 12, and p-type upper cladding or p-type semiconductor layer 13 will be detailed shortly. It is to be noted, however, that the illustrated configuration of the light-generating semiconductor region 2 is by way of example only. On principle, light will be generated if there are only the n-type layer 11 and p-type layer 13, so that either or both of the buffer layer 10 and active layer 12 are omissible. Addition of one or more layers such as a known current-spreading layer or ohmic contact layer is also possible. The light-generating semiconductor region 2 has a pair of opposite surfaces 14 and 15 parallel to the pair of opposite major surfaces 5 and 6 of the substrate 1. The first surface 14 of the light-generating semiconductor region 2 faces away from the substrate 1, and the second surface 15 is held against the substrate. The light generated at the active layer 12 in this embodiment is to be emitted from the surface 14. The other surface 15 of the light-generating semiconductor region 2 is coupled directly to the substrate 1, both mechanically and electrically.

In practice the buffer layer 10 may take the form of a lamination of a required number of alternations of a first and a second buffer sublayer. The first buffer sublayers, which include the one in direct contact with the substrate 1, may be made from any of the aluminum-containing nitrides of the following general composition plus an n-type dopant:

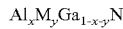

$$Al_xM_yGa_{1-x-y}N$$

where M is at least either of indium and boron; the subscript x is a numeral that is greater than zero and equal to or less than one; the subscript y is a numeral that is equal to or greater than zero and less than one; and the sum of x and y is equal to or less than one.

The particular material employed for the first sublayers of the buffer layer 10 in this embodiment is aluminum nitride (x=1, y=0 in the formula above). Containing aluminum, the first buffer sublayers are closer in both lattice constant and thermal expansion coefficient to the silicon substrate 1 than are the second buffer sublayers. The thickness of each first buffer sublayer may be in the range of about 0.5-5.0 nanometers. If the first buffer sublayers were each less than about 0.5 nanometer thick, the light-generating semiconductor region might not be grown with a required degree of flatness. If they were each more than about five nanometers thick, on the other hand, then the desired quantum mechanical tunnel effect might not be obtained.

The second buffer sublayers are intended to enhance the buffering effect of the buffer layer. For fulfillment of this function the second buffer sublayers may be made from an n-type nitride semiconductor that either does not contain aluminum or does contain it in a less proportion than do the first buffer sublayers. Aside from an n-type dopant the general composition of the second buffer sublayers is definable as:

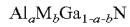

$$Al_aM_bGa_{1-a-b}N$$

where M is at least either of indium and boron; the subscripts a and b are both numerals that are equal to or greater than zero and less than one; the sum of a and b is equal to or less than one; and the subscript a is less than the subscript x in the formula above defining the composition of the first buffer sublayers.

The second buffer sublayers are made from gallium nitride in this embodiment (a=0, b=0). The thickness of each second buffer sublayer may be about 0.5-200 nanometers. If these sublayers were each less than about 0.5 nanometer thick, the light-generating layers 11-13 might not be grown thereon with a desired degree of flatness. If they were each more than about 200 nanometers thick, on the other hand, then the buffer layer 10 might crack.

Since the n-type buffer layer 10 is in a heterojunction with the underlying p-type substrate 1, and since an alloy layer is thermally created therebetween in the course of fabrication, the voltage drop across the junction when the device is forward biased is negligible. Alternatively, the p-type substrate 1 may be replaced by an n-type one, and the n-type buffer layer 10 formed on this n-type substrate. Despite the foregoing disclosure, the buffer layer 10 need not be multi-sublayered but may be of the same composition throughout.

The n-type lower cladding 11 of the light-generating semiconductor region 2 is made from any of the nitride semiconductors that are expressed by the following general formula:

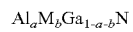

$$Al_aM_bGa_{1-a-b}N$$

where M is at least either of indium and boron; the subscript a is a numeral that is equal to or greater than zero and equal to or less than one and also less than x above; the subscript b is a numeral that is equal to or greater than zero and less than one; and the sum of a and b is equal to or less than one. Preferably, the lower cladding 11 is made from n-type GaN (x=0, y=0) or GaN-based compound semiconductors.

The active layer 12 of the light-generating semiconductor region 2 has any of the nitride semiconductors that are generally definable by the formula:

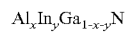

$$Al_xIn_yGa_{1-x-y}N$$

where the subscripts x and y are both numerals that are equal to or greater than zero and less than one. The active layer 12 may be either of the same composition throughout or take the form of the known multiple quantum well structure. The active layer 12 is not doped with a conductivity type determinant in the present embodiment but may be doped with a p- or n-type determinant as required.

The p-type upper cladding 13 of the light-generating semiconductor region 2 is made from any of the nitride semiconductors that are also expressed by the following general formula, plus a p-type dopant:

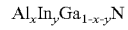

$$Al_xIn_yGa_{1-x-y}N$$

where the subscripts x and y are both numerals that are equal to or greater than zero and less than one. The upper cladding 13 is made from p-type GaN to a thickness of about 500 nanometers in this embodiment.

Figure 3:
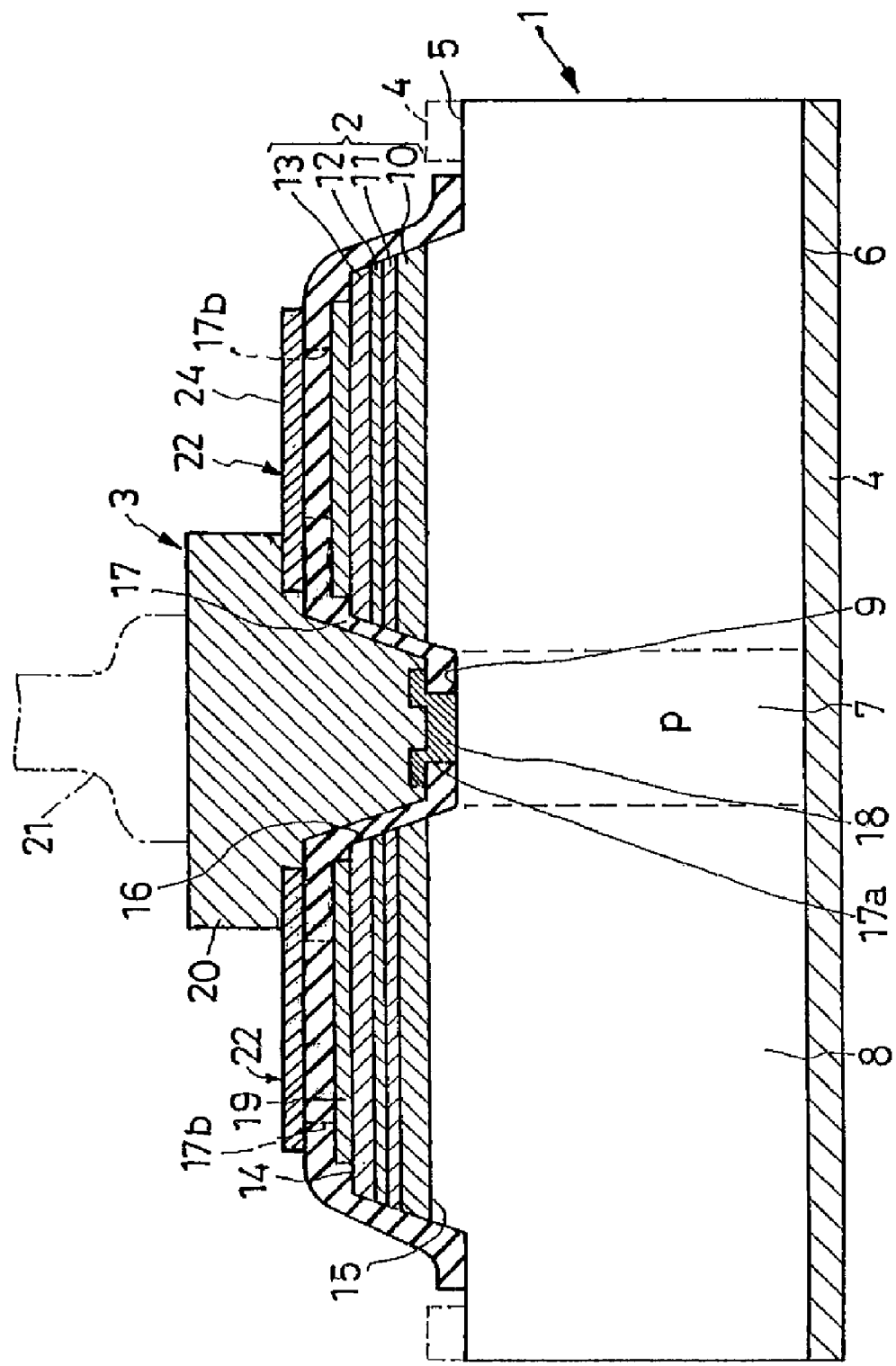
FIG. 3 is a diagrammatic sectional illustration of the LED taken along the line III-III in FIG. 2.
Figure 4:
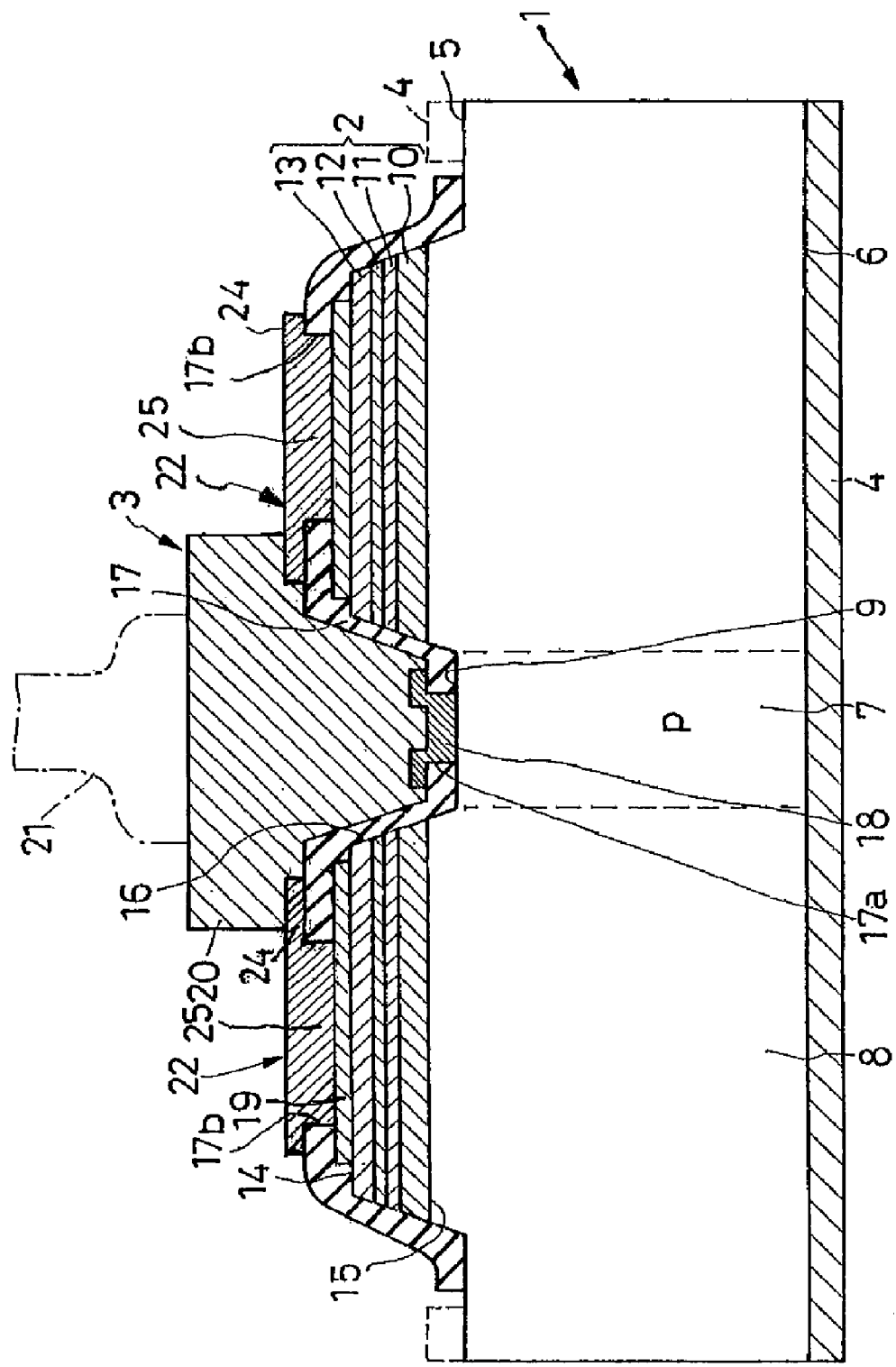
FIG. 4 is a diagrammatic sectional illustration of the LED taken along the line IV-IV in FIG. 2.

With continued reference to FIGS. 3 and 4 the light-generating semiconductor region 2 has the tapering cavity or hole 16 formed centrally therethrough. The tapering cavity 16 is axially aligned with, and joined directly to, the recess 9 in the core section 7 of the substrate 1. The recess 9 has the Schottky electrode 18 on its bottom. Both recess 9 and tapering cavity 16 may be created by etching after epitaxially growing the light-generating semiconductor region 2 on the substrate 1. The etching will remove part of the alloy layer which has been created as aforesaid between substrate 1 and buffer layer 10 during the epitaxial growth of the latter, with consequent exposure of silicon at the bottom of the recess 9.

Figure 2:
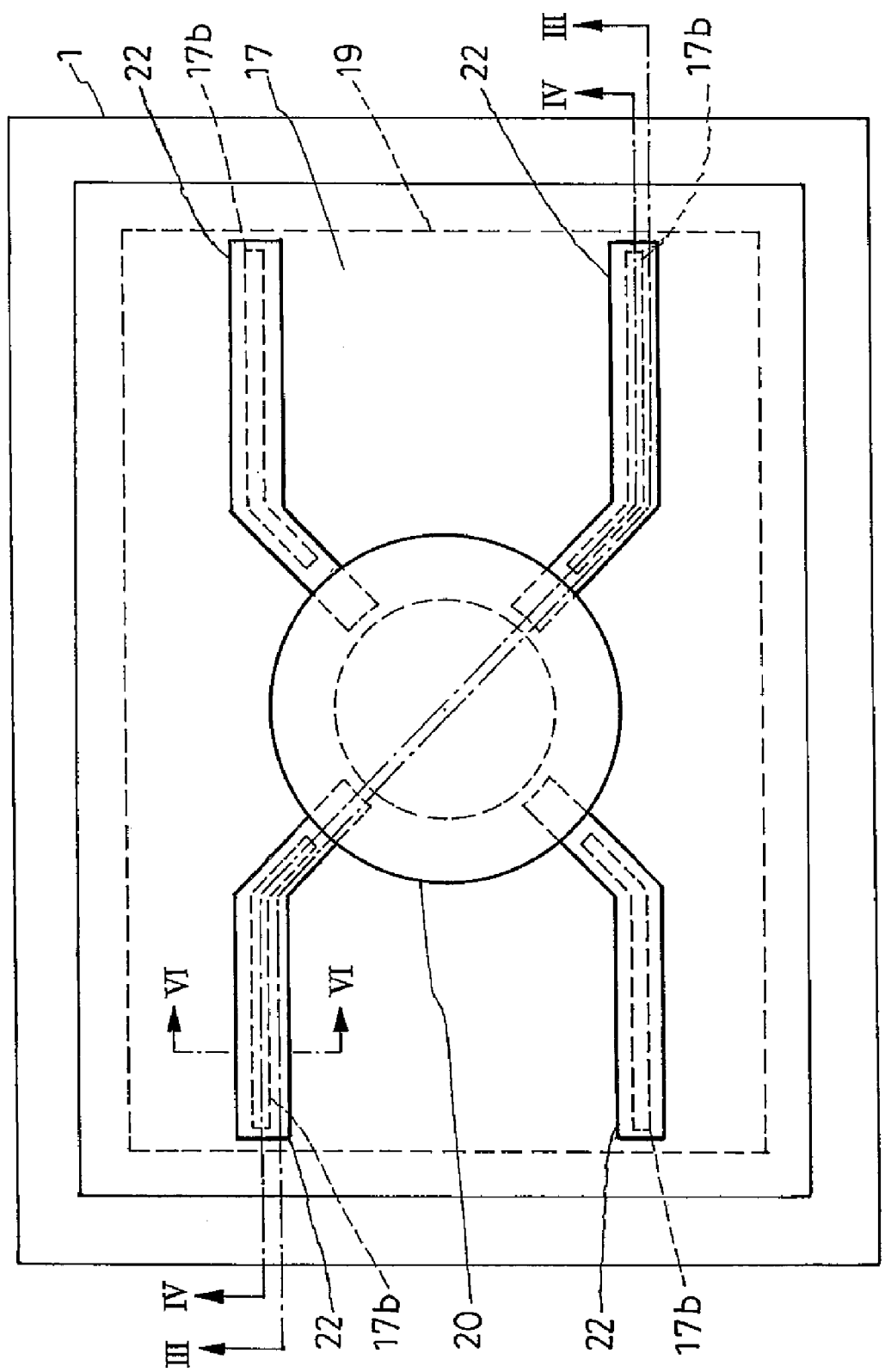
FIG. 2 is a diagrammatic top plan view of the overvoltage-protected, high-efficiency LED embodying the principles of this invention.
Figure 6:
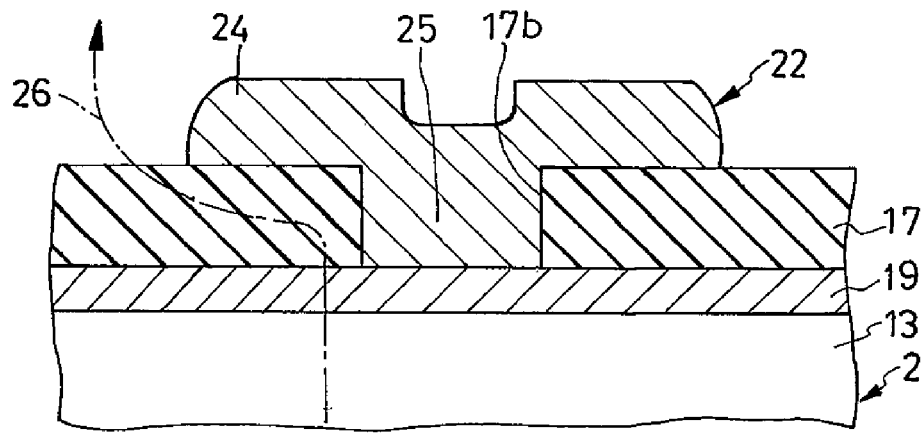
FIG. 6 is an enlarged, fragmentary sectional illustration of the LED taken along the line VI-VI in FIG. 2, showing in particular one connector strip and how it is received in one slit in the transparent overlay into contact with the current-spreading film.
Figure 7:
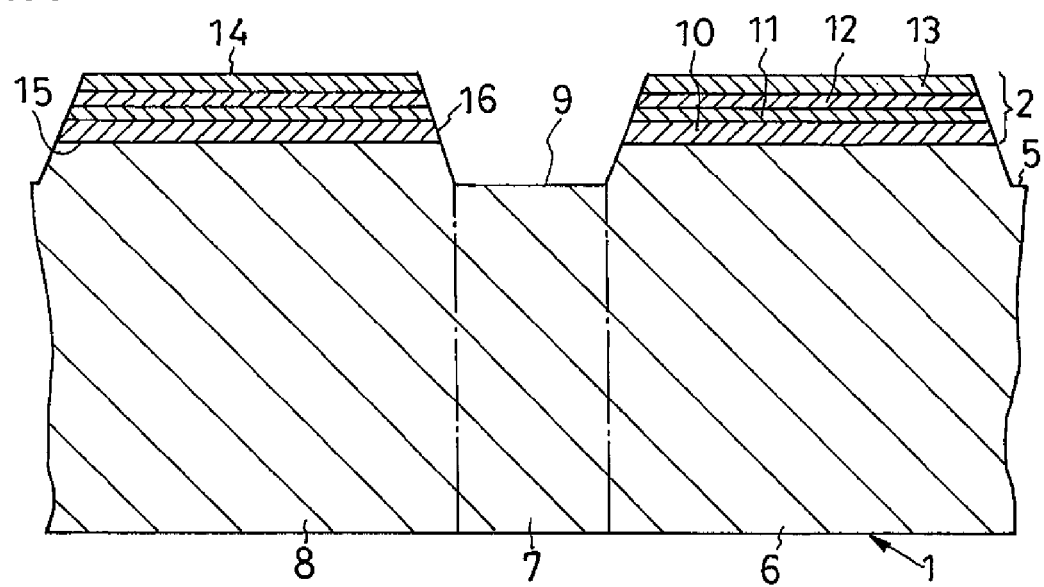
FIG. 7 is an enlarged, fragmentary sectional illustration of the FIG. 2 LED, showing in particular the light-generating semiconductor region and the tapering cavity defined centrally therein.

The front electrode means 3 is comprised of a current-spreading film 19 of ITO, a wire-bonding pad 20, and the set of connector strips 22 best seen in FIGS. 2 and 6. The bonding pad 20 fills the tapering cavity 16 in the light-generating semiconductor region 2 and further overlies a neighboring annular central part of this region 2. The bonding pad 20 is electrically coupled both to the current-spreading film 19 via the connector strips 22 in a manner yet to be described and, directly, to the Schottky electrode 18. Thus the bonding pad 20 serves both as anode for the LED and as cathode for the Schottky barrier diode.

The current-spreading film 19 is in ohmic contact with most of the top surface 14 of the light-generating semiconductor region 2 for a uniform current flow therethrough. Another important requirement of the current-spreading film 19 is to permit the passage of the light therethrough with a minimum of attenuation. In order to meet these requirements the current-spreading film 19 may advantageously be made from ITO to a thickness of 1800 angstroms or so. Other materials are adoptable, however, such as nickel, platinum, palladium, rhodium, ruthenium, osmium, iridium, gold, and silver. Whatever the material employed, it may be filmed to a thickness of, say, 500-5000 angstroms, preferably 1800 angstroms, in order to gain a required degree of transparency with respect to the light created in the light-generating semiconductor region 2.

Made so thin, however, the current-spreading film 19 will become rather inconveniently high in sheet resistance and so run counter to the objective of assuring constant current flow throughout the light-generating semiconductor region. The connector strips 22, through which the bonding pad 20 is electrically coupled to the current-spreading film 19, is specially contrived according to the invention in order to overcome this difficulty. The improved construction of the connector strips 22 is closely associated with that of the insulating film 17, another important feature of the invention.

An inspection of FIGS. 2-5 will reveal that the transparent overlay 17 covers the complete surfaces of the light-generating semiconductor region 2, either directly or via the current-spreading film 19, as well as the substrate surfaces bounding the recess 9, and part of the annular margins of the top surface 5 of the substrate 1. The transparent overlay 17 is designed to perform the functions of:

1. Electrically isolating the bonding pad 20 from the light-generating semiconductor region 2.
2. Electrically isolating the bonding pad 20 from the substrate 1.
3. Physically protecting the exposed surfaces of the substrate 1 and light-generating semiconductor region 2.
4. Chemically protecting the current-spreading film 19 from the etchant in patterning the connector strips 22.
5. Mitigating the stresses exerted from the bonding pad 20 on the light-generating semiconductor region 2.
6. Bounding the positions where the connector strips 22 are joined to the current-spreading film 19.

The transparent overlay 17 will meet all the foregoing requirements if made from silicon dioxide or silica, $SiO_2$, among other materials. Silica is better in transparency than ITO from which is made the current-spreading film 19, so that the transparent overlay 17 can be made thicker (e.g., 1500-10,000 angstroms) than the current-spreading film for the same degree of transparency therewith out deteriorating the overall efficiency of the LED.

Figure 5:
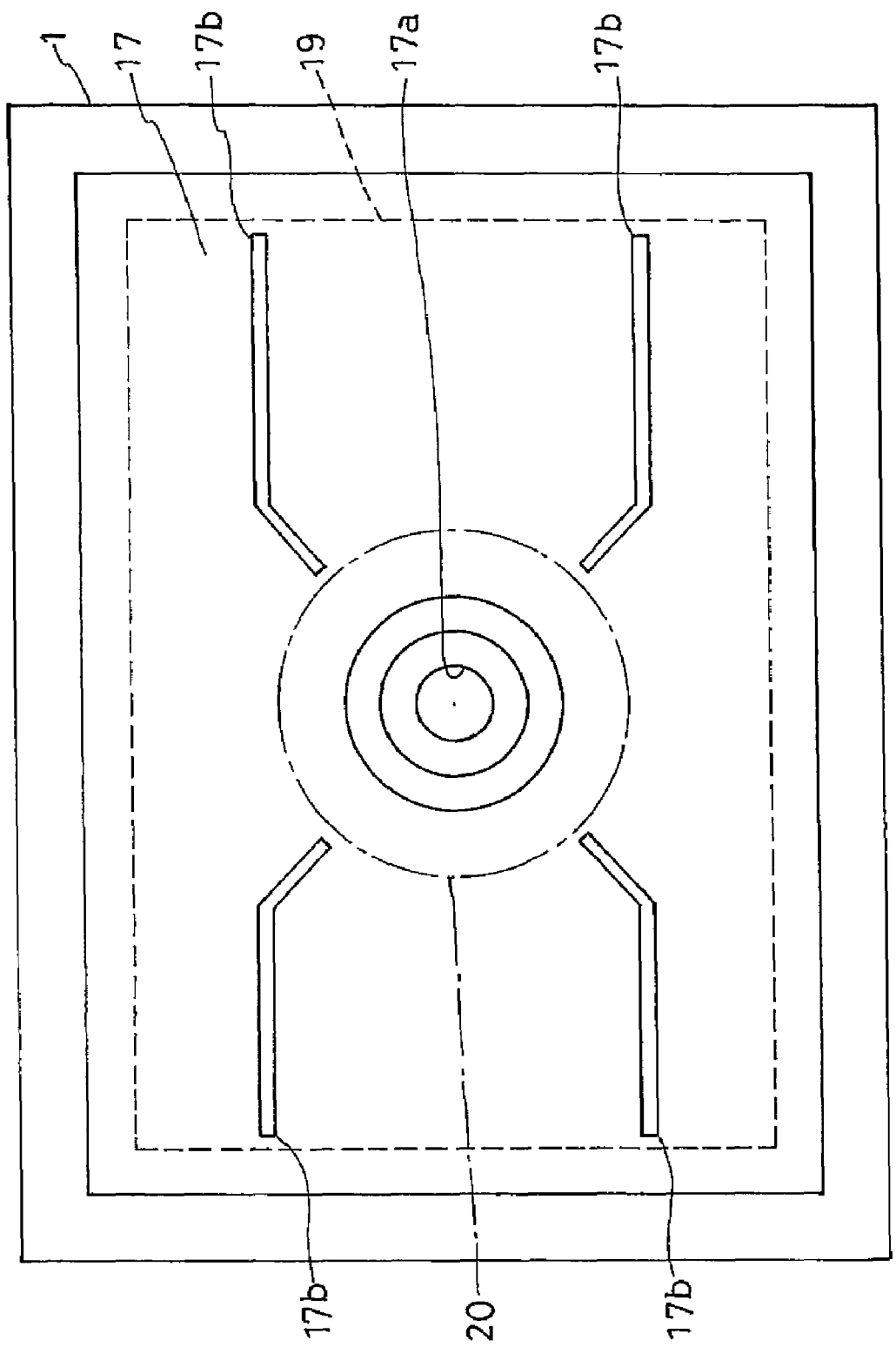
FIG. 5 is a diagrammatic top plan view of the transparent overlay and underlying parts of the FIG. 2 LED.

FIGS. 4 and 5 in particular indicate that the transparent overlay 17 has an opening $17_a$ defined centrally therein and a plurality of, four in this particular embodiment, holes or slits $17_b$ extending approximately radially from the immediate vicinity of the bonding pad 20. The opening $17_a$ has the Schottky electrode 18 extending therethrough into direct contact with the core section 7 of the substrate 1 on one hand and, on the other, with the bonding pad 20.

The slits $17_b$ in the transparent overlay 17 are designed to permit the connector strips 22 to extend therethrough into direct contact with the current-spreading film 19. The slits $17_b$ are each bent as in FIG. 5 in order to conform to the rectangular, instead of square, shape of the device as seen in a plan view as in FIGS. 2 and 5. If the shape of the device permitted, the slits $17_b$ could each be straight and all in radial arrangement. Each slit $17_b$ should have one extremity thereof placed as close as possible to the bonding pad 20, and the other extremity as close as possible to the boundary of the current-spreading film 19. The width of each slit $17_b$ should be less than that of each connector strip 22 at most and, preferably, as small as practical, provided that the connector strips can electrically connect the bonding pad 20 to the current-spreading film 19. From two to 10 micrometers is a preferred width range of each slit $17_b$.

As has been set forth in connection with the inside insulating film 17' of the FIG. 1 device, the transparent overlay 17 has it among its intended objectives to alleviate the stresses exerted by the bonding pad 20 on the light-generating semiconductor region 2. The slits $17_b$ in the transparent overlay 17 are wholly out of register with the bonding pad 20, and the transparent overlay has its unslitted, annular part caught between the bonding pad and the light-generating semiconductor region 2. Despite the slitting, therefore, the transparent overlay 17 can well fulfill the objective of stress alleviation.

As there are four slits $17_b$ as in FIG. 5 in this particular embodiment, so there are as many connector strips 22 as in FIG. 2. As depicted on an enlarges scale in FIG. 6, each connector strip 22 is in the shape of a T in cross section, comprising a strip section 24 and a rib section 25. The strip section 24 of each connector strip 22 overlies the transparent overlay 17 whereas the rib section 25 is received in one slit $17_b$ in the transparent overlay into contact with the current-spreading film 19.

As best indicated in FIG. 2, the rib section 25 of each connector strip 22 does not extend throughout the length of the strip section 24 but terminates short of at least the inside extremity, preferably both extremities, of the latter. Consequently, although the slits $17_b$ in the transparent overlay 17 do not underlie the bonding pad 20 as aforesaid, one end of the strip section 24 of each connector strip 22 can be placed under the bonding pad as in FIGS. 2-4. Thus is the bonding pad 20 electrically coupled to the current-spreading film 19 via the connector strips 22 so as to assure a uniform current distribution throughout the light-generating semiconductor region 2.

The connector strips 22 should be less in both resistivity and sheet resistance than the current-spreading film 19 for conveying the current throughout their length. A recommended method of fabricating the connector strips 22 is to deposit gold onto the entire surface of this transparent overlay 17 to a thickness of 2500-100,000 angstroms, thereby concurrently filling up all the slits $17_b$ in the transparent overlay. Then the gold deposit may be selectively etched away from over the transparent overlay 17 so as to leave only the rib sections 25 received in the slits $17_b$ and the strip sections 24 on the neighboring surface portions of the transparent overlay. Alternatively, instead of being made solely from gold, the connector strips 22 may each be a two-layer lamination of gold-germanium alloy and gold or of other metals or alloys.

The strip section 24 of each connector strip 22 is so much wider than each slit $17_b$ in the transparent overlay 17 that it transversely extends some distances in opposite directions from the lateral edges of the transparent overlay 17 bounding the slit $17_b$ in which the rib section 25 of the connector strip is snugly received. Thus, positively engaging the transparent overlay 17 throughout the length of each slit $17_b$, the connector strip 22 is not to break either transversely or longitudinally into the strip section 24 and rib section 25. In other words, the strip section 24 is connected to the current-spreading film 19 through the edge of the slit $17_b$. The length of the edge of the slit $17_b$ is greater than the width of the slit $17_b$. Therefore, the connector strip 22 is not to break.

The rib sections 25 of the connector strips 22 extend from the immediate vicinity of the bonding pad 20 close to the outer edges of the current-spreading film 19 as they fill the complete slits $17_b$. Further, since the strip sections 24 of the connector strips 22 are positively caught under the bonding pad 20, the connector strips will coact with the current-spreading film 19 to favorably distribute the current from the bonding pad throughout the light-generating semiconductor region 2.

With reference back to FIGS. 3 and 4 the Schottky electrode 18 of the overvoltage protector is made from any one or more of titanium, platinum, chromium, aluminum, samarium, platinum silicate, and praseodymium silicate. Received in the central opening $17_a$ in the transparent overlay 17, the Schottky electrode 18 makes Schottky contact with the substrate 1. The core section 7 of the substrate 1 and the Schottky electrode 18 make up in combination the overvoltage-protecting Schottky diode. Despite the provision of the Schottky diode, both substrate 1 and light-generating semiconductor region 2 are kept at a minimum in size as the Schottky electrode 18 is compactly placed under the bonding pad 20, and the Schottky diode is disposed between the bonding pad 20 and the bottom surface 6 of the substrate 1.

The bonding pad 20 may be made from gold, nickel or like material that is less in resistivity than the current-spreading film 19. The bonding pad 20 is electrically coupled directly to both Schottky electrode 18 and connector strips 22 and is to have a wire 21, FIGS. 3 and 4, of aluminum or gold bonded thereto for connection of the LED to external circuitry. The bonding pad 20 must be sufficiently thick (e.g., 100 nanometers to 100 micrometers) to withstand the bonding of the wire 21, so that it is nontransparent to the light from the light-generating semiconductor region 2. The bonding pad 20 is shown in FIG. 2 to be circular as seen in a plan view as in this figure. Alternatively, it might be elliptic, square, polygonal, or otherwise. The substrate 1 might also be variously modified in shape in conformity with the alternative shapes. It is desired that the bonding pad 20 wholly cover the core section 7 of the substrate 1 as seen in a plan view, although no serious problem would occur if it failed to do so.

The substrate electrode 4, FIGS. 3 and 4, is a metal layer covering the complete bottom surface 6 of the substrate 1 in ohmic contact with both core section 7 and outer section 8. This substrate electrode could be disposed along the periphery of the top surface 5 of the substrate 1, as indicated by the phantom outline in both FIGS. 3 and 4.

As equivalently diagramed in FIG. 8, the overvoltage-protected LED so far described with reference to FIGS. 2-7 provides an inverse-parallel connection of an LED 31 and a Schottky barrier diode 32. The Schottky barrier diode conducts when an overvoltage, or short-duration electrical transients known as voltage surges or spikes, is inversely applied to the LED 31. The maximum possible voltage across the LED 31 is thus limited to the forward voltage of the Schottky barrier diode 32, so that the LED is protected from inverse overvoltages due to static electricity and other causes and from consequent destruction or severe weakening. It is understood that the forward turn-on voltage of the Schottky barrier diode 32 is less than the maximum allowable reverse voltage of the LED 31, The advantages gained by the overvoltage-protected LED, set forth hereinbefore with reference to FIGS. 2-8, may be recapitulated as follows:

1. The transparent overlay 17 is of unitary construction, instead of being split into two parts as in the prior art of FIG. 1, so that it is capable of fabrication in one step.

2. Extending over the unitary transparent overlay 17, the connector strips 22 are ribbed for electrical contact with the current-spreading film 19 via the slits $17_b$ in the transparent overlay. The ribbed connector strips 22 are themselves greater in cross-sectional size and less susceptible to breakage than their conventional unribbed counterparts 22', FIG. 1.

3. The ribbed connector strips 22 extend over the unitary transparent overlay 17 without being bent like their conventional counterparts 22'. For this reason, too, the connector strips according to the invention are less likely to break. In other words, the strip section 24 is connected to the current-spreading film 19 through the edge of the slit $17_b$. The length of the edge of the slit $17_b$ is greater than the width of the slit $17_b$. Therefore, the connector strip 22 is not to break.

4. Made less in resistivity than the current-spreading film 19, the connector strips 22 assure a more uniform current distribution throughout the light-generating semiconductor region 2 than in the case where the current-spreading film is coupled directly to the bonding pad. A uniform current distribution in the active layer 12 of the light-generating semiconductor region leads to light emission with a higher efficiency.

5. The light-generating semiconductor region 2 is protected against stresses from the bonding pad 20 by the stress-mitigating transparent overlay 17 interposed therebetween.

6. Made from silica, the transparent overlay 17 is higher in transparency than the ITO-made current-spreading film 19 and also thicker than the latter. The light generated right under the connector strips 22 is therefore directed outwardly through the transparent overlay 17, as indicated highly diagrammatically by the arrow-headed dot-and-dash line in FIG. 6, for further enhancement of efficiency. No such light emission from under the connector strips 22 would occur if they were directly held against the current-spreading film 19 throughout their transverse dimension.

7. The current-spreading film 19 is guarded by the overlying transparent overlay 17 from the action of the etchant during the in-situ patterning of the connector strips 22.

8. The overvoltage-protecting Schottky barrier diode is compactly disposed under the bonding pad 20 without lessening the effective light-emitting surface of the LED or increasing the overall size of the LED.

9. The overvoltage-protecting Schottky barrier diode is simple and inexpensive in conduction as it makes use of the core section 7 of the substrate 1.

Figure 9:
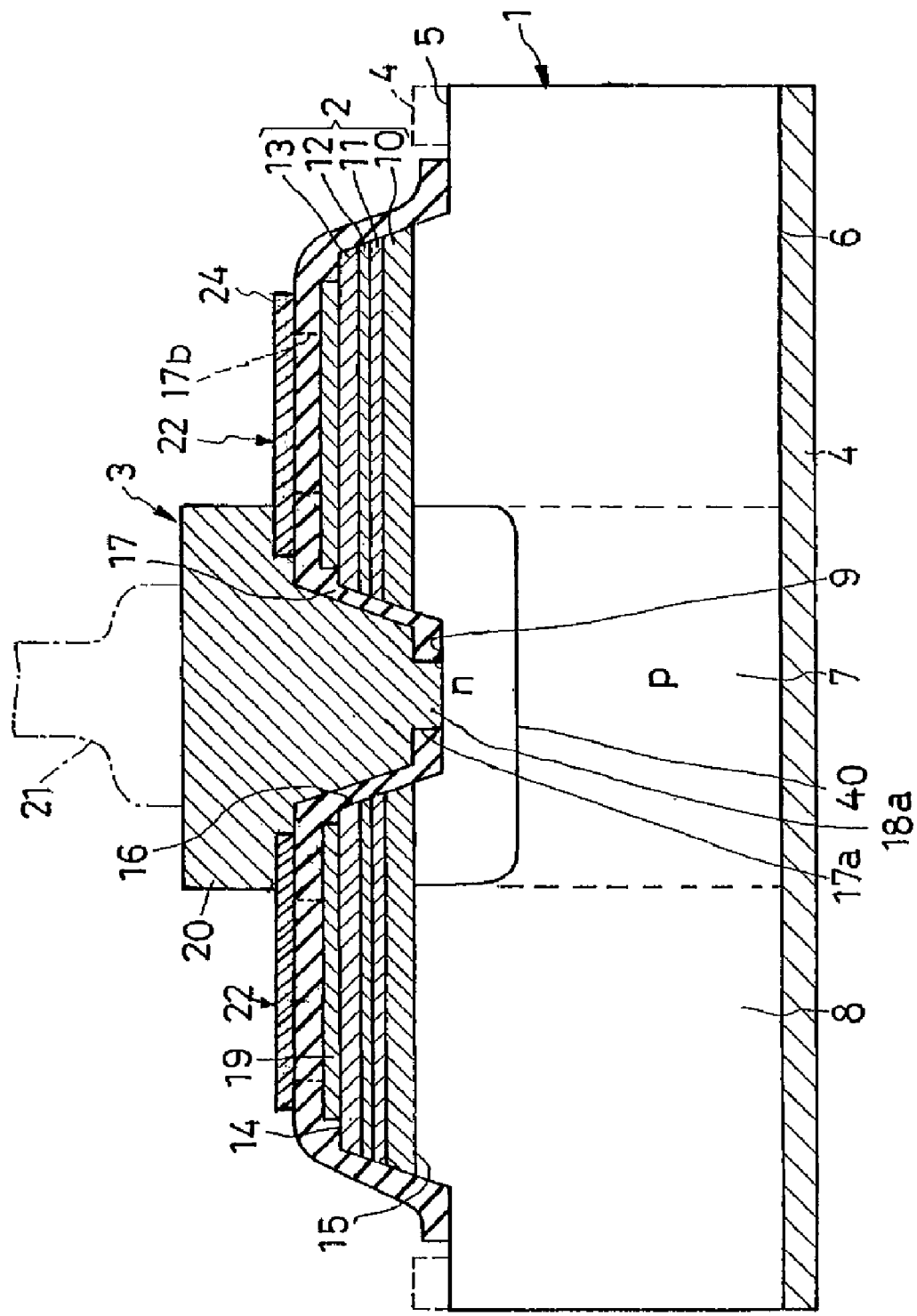
FIG. 9 is an illustration similar to FIG. 3 but showing another preferred form of overvoltage-protected, high-efficiency LED according to the invention.

Embodiment of FIG. 9

A pn-junction diode is employed in this embodiment as an overvoltage protector in place of the Schottky barrier diode of the preceding embodiment. An n-type semiconductor region 40 is formed in part of the core section 7 of the substrate 1 for providing the pn-junction diode. All the other details of construction are as set forth above in connection with the FIGS. 1-8 embodiment except for the absence of the Schottky electrode.

The pn-junction diode is comprised of the p-type semiconductor substrate 1 and n-type semiconductor region 40, forming a pn-junction therebetween. The n-type semiconductor region 40 is created by diffusing an n-type conductivity determinant into the core section 7 of the substrate 1 from its top surface 5.

The vacancy created by the absence of the Schottky barrier diode of the preceding embodiment is filled by part $18_a$ of the bonding pad 20 which extends through the central opening $17_a$ in the transparent overlay 17 into ohmic contact with the n-type semiconductor region 40. As required, there may be interposed between bonding pad 20 and n-type semiconductor region 40 a layer of a metal that makes better ohmic contact with the region 40. The n-type semiconductor region 40 is shown to lie wholly in register with the bonding pad 20. Preferably, and speaking more broadly, the n-type semiconductor region 40 should not laterally extend beyond the bonding pad 20 as seen in a direction normal to the substrate surface 5. In other words, the pn-junction diode is disposed between the bonding pad 20 and the bottom surface 6 of the substrate 1.

It is now apparent that the front electrode means 3 and back electrode 4 serve as the electrode pair for both LED and pn-junction diode. The equivalent circuit of this overvoltage-protected LED is therefore an inverse-parallel connection of LED and pn-junction diode, similar to that shown in FIG. 8 for the preceding embodiment except for replacement of the Schottky barrier diode by the pn-junction diode. The pn-junction diode functions just like the Schottky barrier diode, protecting the LED from reverse voltage spikes or like overvoltages by conducting current upon application to the LED of a reverse overvoltage in excess of a predefined limit.

This embodiment is equipped with all the current-spreading, efficiency-enhancing features of the preceding embodiment, including the ribbed connector strips 22, slitted transparent overlay 17, and current-spreading film 19. All the listed advantages accruing from these features of the invention are therefore also due to this embodiment.

Figure 10:
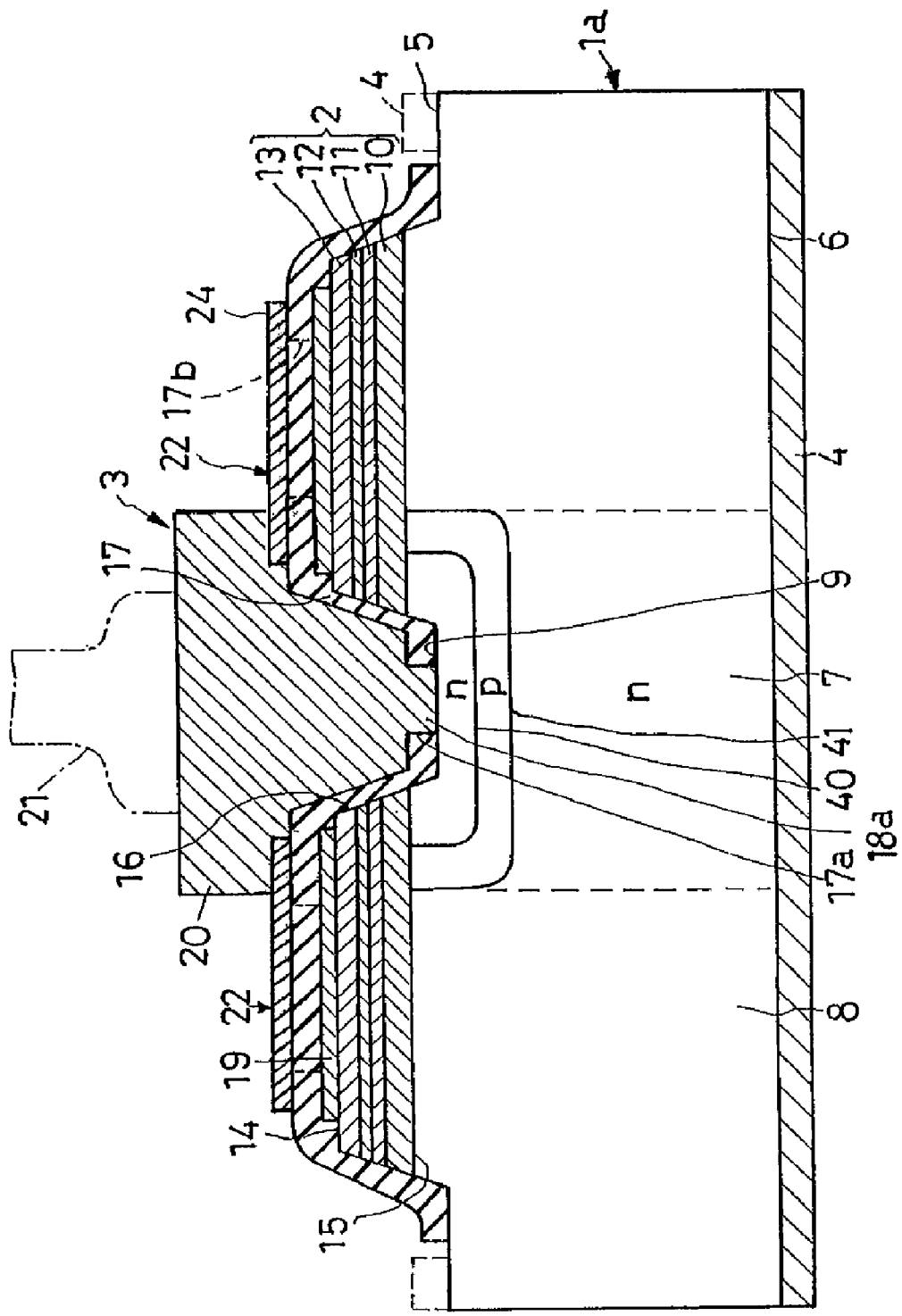
FIG. 10 is also an illustration similar to FIG. 3 but showing still another preferred form of overvoltage-protected, high-efficiency LED according to the invention.

Embodiment of FIG. 10

This LED employs as an overvoltage protector a bidirectional trigger diode known as a DIAC (Diode for Alternating Current) instead of the Schottky barrier diode of the FIGS. 2-8 embodiment or the pn-junction diode of the FIG. 9 embodiment. This overvoltage-protected LED adopts an n-type silicon substrate $1_a$ in lieu of the p-type one of the foregoing embodiments in order to incorporate the DIAC. Further, for providing the DIAC, an n-type semiconductor region 40 and p-type semiconductor region 41 are created in parts of the core section 7 of the n-type substrate $1_a$. The p-type region 41 is defined islandlike in the substrate $1_a$ and exposed at the substrate surface 5. The n-type region 40 is formed islandlike in the p-type region 41 and also exposed at the substrate surface 5. The n-type substrate $1_a$, p-type region 41, and n-type region 40 constitute in combination the overvoltage-protecting npn DIAC. All the other details of construction are as set forth above in connection with the FIGS. 2-8 embodiment.

The n-type DIAC region 40 of the substrate 1 is less than the bonding pad 20 in dimensions in a plane parallel to the substrate surface 5. Disposed in register with the bonding pad 20, the p-type DIAC region 41 surrounds the n-type DIAC region 40 except its surface exposed at the substrate surface 5. In other words, the DIAC is disposed between the bonding pad 20 and the bottom surface 6 of the substrate 1. The p-type DIAC region 41 is first formed by diffusing a p-type conductivity determinant into the n-type substrate $1_a$, creating a pn junction. Then is formed the n-type DIAC region 40 by diffusing an n-type conductivity determinant into the p-type DIAC region 41, creating another pn junction. The bonding pad 20 has its part $18_a$ extending through the central opening $17_a$ in the transparent overlay 17 into ohmic contact with the n-type DIAC region 40, either directly or via an optional ohmic contact layer mentioned above.

Figure 8:
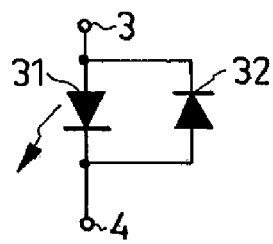
FIG. 8 is an equivalent electrical circuit diagram of the FIG. 2 LED.

Again, the equivalent circuit of this overload-protected LED is similar to that diagramed in FIG. 8 for the first disclosed embodiment, only with the DIAC employed in place of the Schottky barrier diode. The DIAC protects the LED from both forward and reverse overvoltages, conducting current in response to the application of such overvoltages to the LED. This embodiment is also equipped with all the noted current-spreading, efficiency-enhancing features of the FIGS. 2-8 embodiment and so gains all the listed advantages accruing from these features of the invention.

Figure 11:
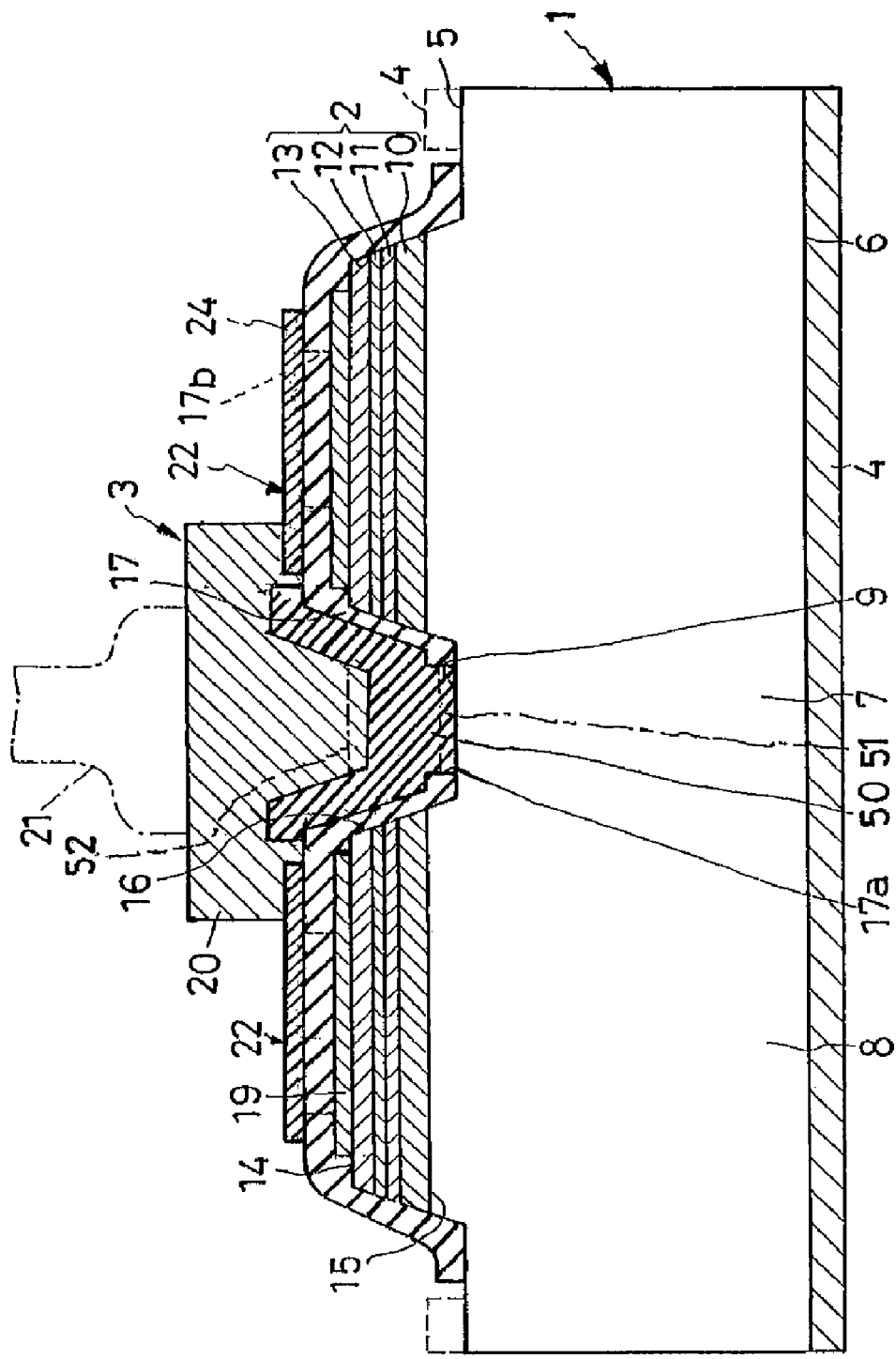
FIG. 11 is also an illustration similar to FIG. 3 but showing a further preferred form of overvoltage-protected, high-efficiency LED according to the invention.

Embodiment of FIG. 11

This embodiment is similar in construction to that of FIGS. 2-8 except that a thick-film capacitor is employed as an overvoltage protector instead of the Schottky barrier diode. The overvoltage-protecting capacitor includes a thick-film dielectric layer 50 received mostly in the tapering cavity 16 in the light-generating semiconductor region 2 and so interposed between substrate 1 and bonding pad 20.

The thick-film dielectric layer 50 may be made from dielectric ceramics with a specific dielectric constant in the range of 1200-2000, which is higher than that of silica from which is made the transparent overlay 17. A currently preferred example of such dielectric ceramics consists of a major ingredient selected from among Groups II and IV metal oxides such as barium titanate ($BaTiO_3$) and strontium titanate ($SrTiO_3$), and an additive or additives selected from among Groups III and V metal oxides. The Group III the additives include neodymium oxide ($Nd_2O_3$), lanthanum oxide ($La_2O_3$), dysprosium oxide ($Dy_2O_3$), samarium oxide ($Sm_2O_3$), praseodymium oxide ($Pr_2O_3$), gadolinium oxide ($Gd_2O_3$), and holmium oxide ($Ho_2O_3$). The Group V additives include niobium oxide ($Nb_2O_5$) and tantalum oxide ($Ta_2O_5$).

The thick-film dielectric layer 50 may be formed by pasting a pulverized dielectric ceramic with an organic binder, coating the paste in place, and baking the coating. Another possible method is to bake a raw, so-called green, sheet of a dielectric ceramic in place. The thick-film dielectric layer 50 contacts the substrate 1 on one hand and the bonding pad 20 on the other, altogether providing the overvoltage-protecting thick-film capacitor.

The equivalent circuit of this overload-protected LED is similar to that diagramed in FIG. 8, only with the thick-film capacitor employed for overvoltage protection in lieu of the Schottky barrier diode. The capacitor is capable of protecting the LED from voltage spikes. This embodiment is also equipped with all the noted current-spreading, efficiency-enhancing features of the FIGS. 2-8 embodiment and so gains all the listed advantages accruing therefrom.

Optionally, as indicated by the broken lines in FIG. 11, capacitor electrodes may be provided at 51 and 52. The illustrated thick-film capacitor is itself replaceable by a capacitor chip installed between substrate 1 and bonding pad 20.

Figure 12:
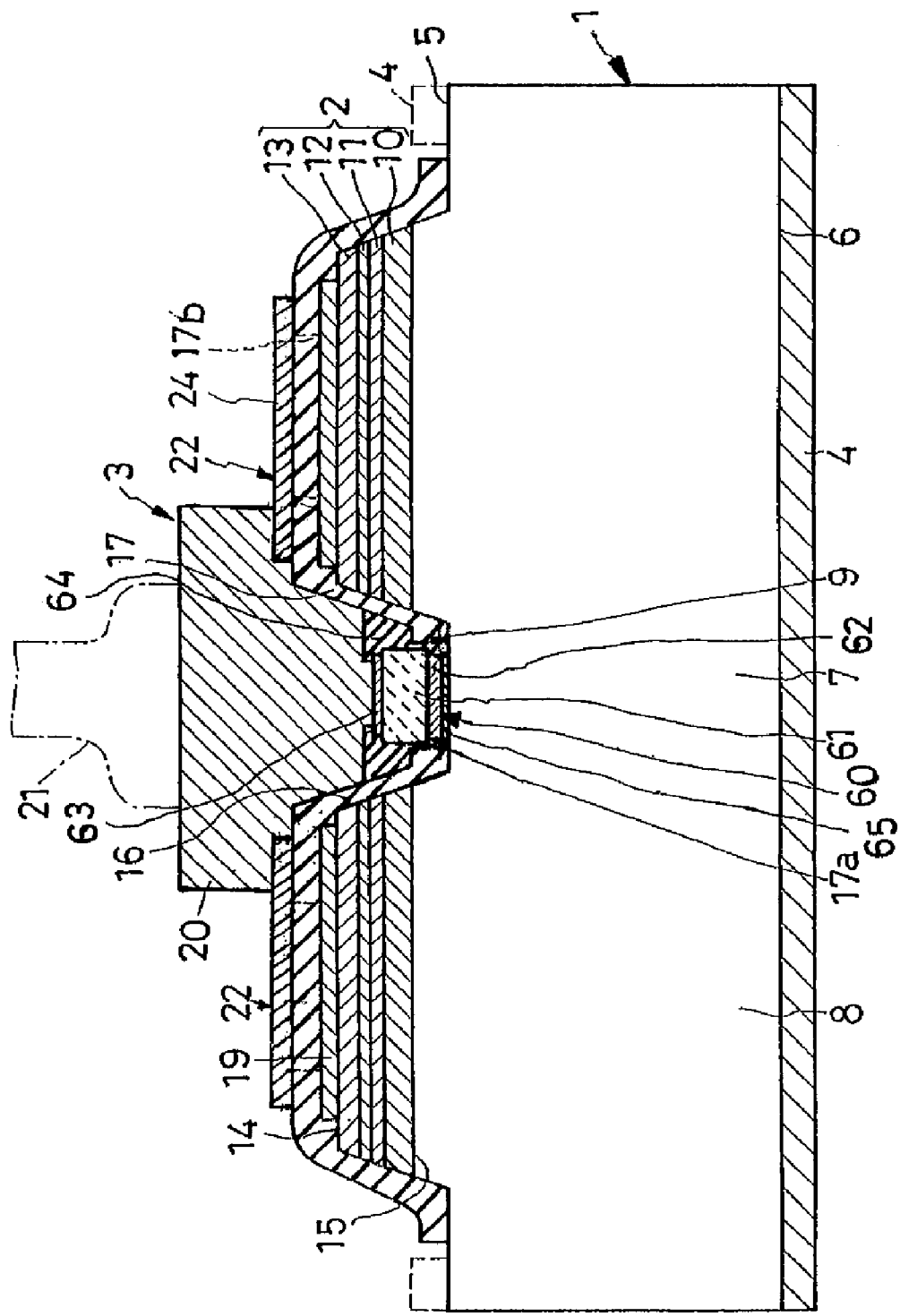
FIG. 12 is also an illustration similar to FIG. 3 but showing a further preferred form of overvoltage-protected, high-efficiency LED according to the invention.

Embodiment of FIG. 12

This embodiment employs a varistor 60 in chip form as an overvoltage protector and is otherwise similar in construction to that of FIGS. 2-8. The overvoltage-protecting varistor 60 comprises a semiconducting ceramic layer 61 and a pair of electrodes 62 and 63 on its opposite sides. An insulator is shown provided at 64 in order to electrically insulate the varistor electrode 62 from the bonding pad 20. The overvoltage-protecting varistor 60 is disposed between the bonding pad 20 and the bottom surface 6 of the substrate 1.

The ceramic layer 61 of the overvoltage-protecting varistor 60 may contain a major proportion of $BaTiO_3$, $SrTiO_3$, ZnO or the like and a minor proportion of $Nb_2O_5$, $Pr_6O_{11}$ or the like. The varistor electrode 62 is electrically coupled, via an electroconductive bonding agent, to an ohmic contact electrode 65 on the surface 5 of the substrate 1. The other varistor electrode 63 is in direct contact with the bonding pad 20. This varistor 60 may have a varistor voltage of 10 volts or so.

The equivalent circuit of this overvoltage-protected LED is a parallel connection of the LED and the varistor. The varistor protects the LED from transient voltages. This embodiment is also equipped with all the noted current-spreading, efficiency-enhancing features of the FIGS. 2-8 embodiment and so gains all the listed advantages accruing therefrom.

Figure 13:
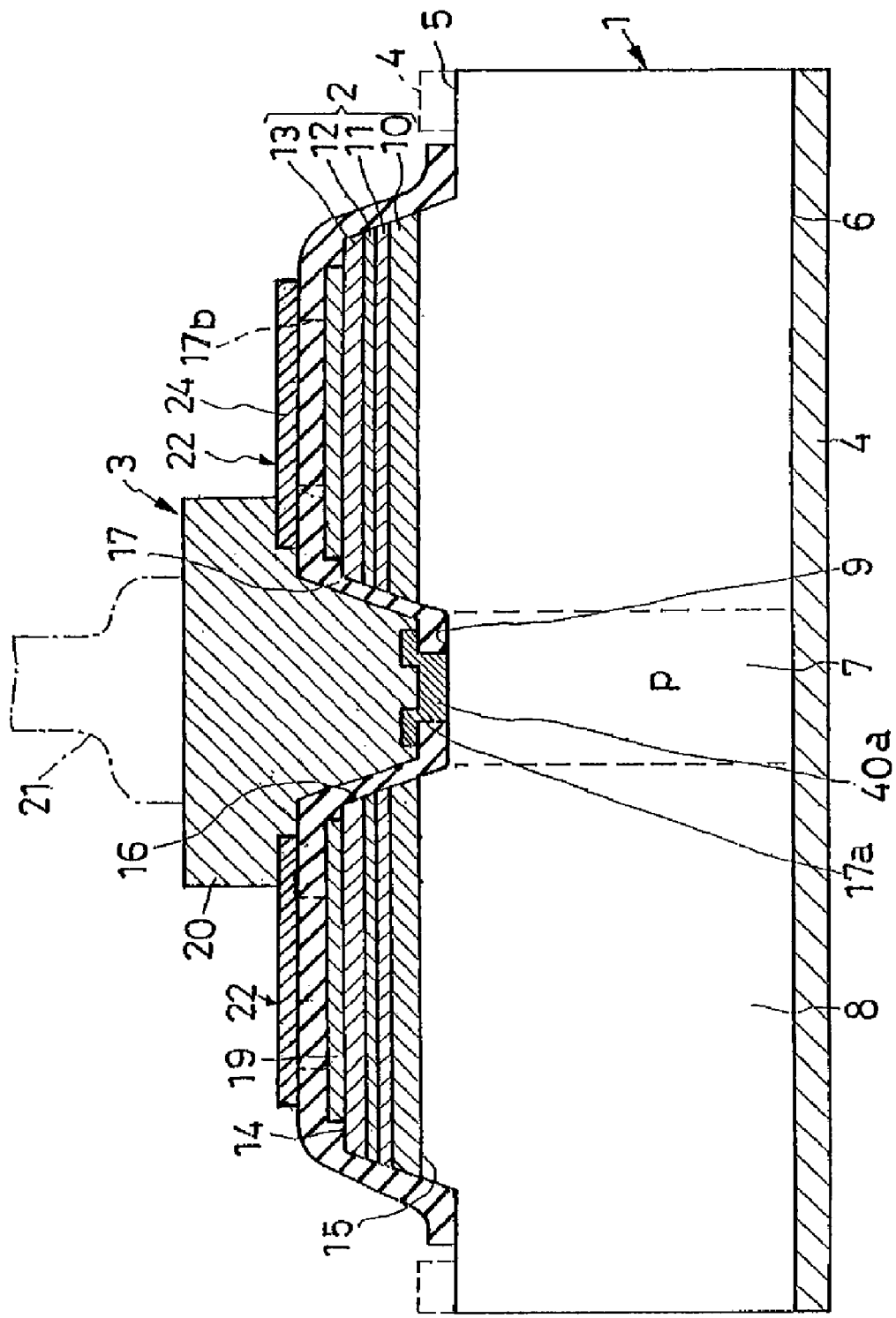
FIG. 13 is also an illustration similar to FIG. 3 but showing a further preferred form of overvoltage-protected, high-efficiency LED according to the invention.

Embodiment of FIG. 13

This embodiment employs an n-type semiconductor film $40_a$ in place of the Schottky electrode 18 of the FIGS. 2-8 embodiment but is otherwise akin in construction to this latter embodiment. The semiconductor film $40_a$ is formed between p-type substrate 1 and bonding pad 20 to a thickness ranging from one nanometer to one micrometer by any such known method as physical or chemical vapor deposition, sputtering, or printing or coating.

Materials adoptable for the semiconductor film $40_a$ include amorphous silicon, ITO, ZnO, $SnO_2$, $In_2O_3$, ZnS, ZnSe, $ZnSb_2O_6$, CdO, $CdIn_2O_4$, $MgIn_2O_4$, $ZnGa_2O_4$, $CdGa_2O_4$, $Ga_2O_3$, $GaInO_3$, $CdSnO_4$, $InGaMgO_4$, $InGaZnO_4$, $Zn_2In_2O_5$, $AgSbO_3$, $Cd_2Sb_2O_7$, $Cd_2GeO_4$, $AgInO_2$, CdS, and CdSe.

The n-type semiconductor film $40_a$ is similar in function to the n-type semiconductor region 40 of the FIG. 9 embodiment, creating a pn junction between itself and the p-type substrate 1. The equivalent circuit of the present embodiment is therefore similar to that of FIG. 8 except that the Schottky barrier diode is replaced by a pn-junction diode, the latter being also capable of protecting the LED from voltage spikes or like transients. This embodiment is also equipped with all the noted current-spreading, efficiency-enhancing features of the FIGS. 2-8 embodiment and so gains all the listed advantages accruing therefrom.

Figure 14:
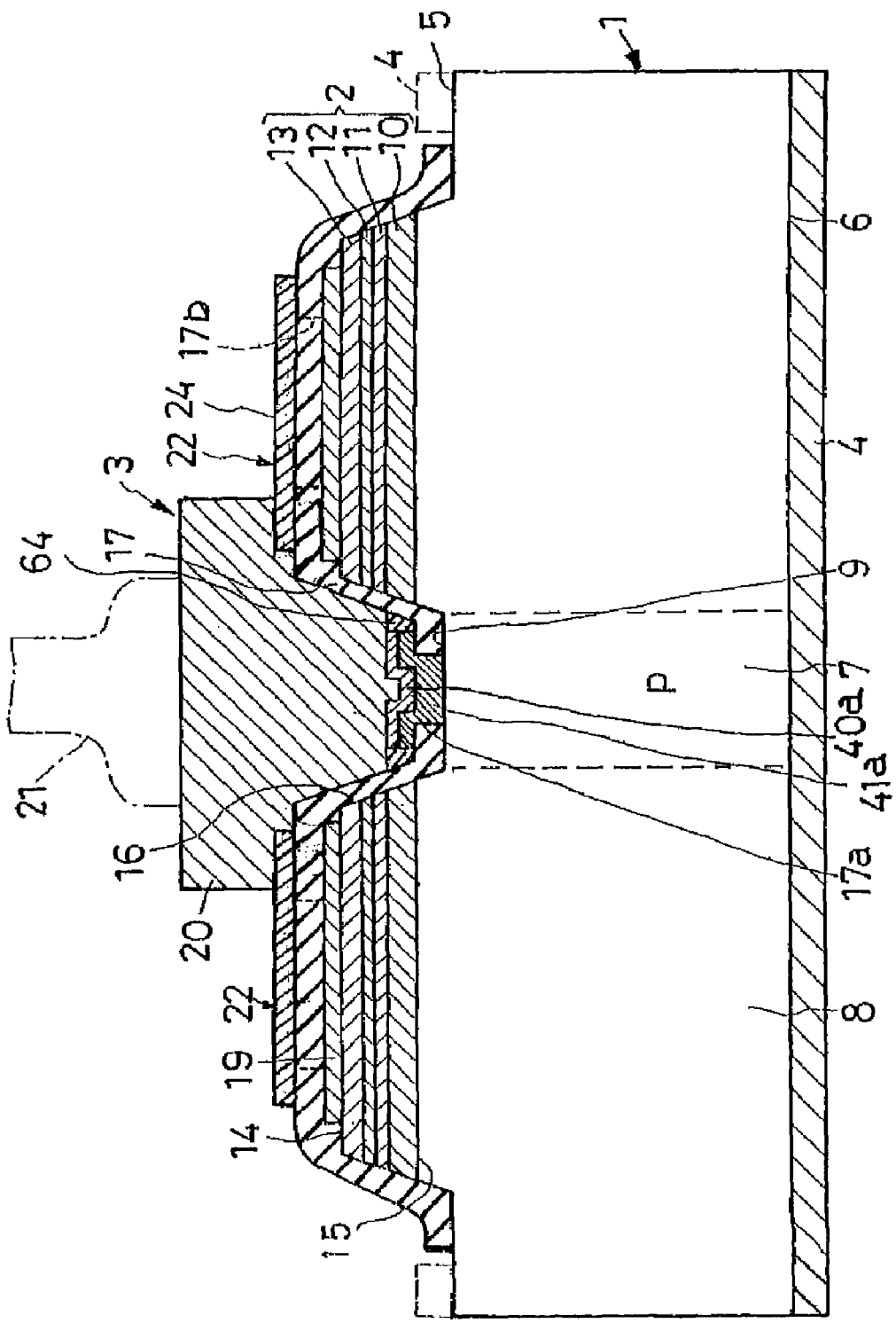
FIG. 14 is also an illustration similar to FIG. 3 but showing a further preferred form of overvoltage-protected, high-efficiency LED according to the invention.

Embodiment of FIG. 14

This embodiment differs in construction from that of FIGS. 2-8 only in that the Schottky electrode 18 of the latter embodiment is replaced by a combination of an n-type semiconductor film $40_a$ and p-type semiconductor film $41_a$. Another description of this feature is possible: The p-type film $41_a$ is interposed between p-type substrate 1 and n-type film $40_a$ in the FIG. 13 embodiment. Each side of the n-type semiconductor film $40_a$ and the p-type semiconductor film $41_a$ is covered with an insulator 64.

The p-type film $41_a$ may be fabricated to a thickness ranging from one nanometer to one micrometer by any such known method as physical or chemical vapor deposition, sputtering, or printing or coating. Materials adoptable for the p-type film $41_a$ include amorphous silicon, NiO, $Cu_2O$, FeO, $CuAlO_2$, $CuGaO_2$, and $SrCu_2O_2$.

A pn-junction diode is also formed in this embodiment as a pn junction is created between n-type film $40_a$ and p-type film $41_a$, these films being in ohmic contact respectively with the bonding pad 20 and with the p-type substrate. The equivalent circuit of this embodiment is therefore similar to that of FIG. 8 except that the Schottky barrier diode is replaced by a thin-film pn-junction diode, the latter being capable of protecting the LED from voltage spikes or like transients. This embodiment is also equipped with all the noted current-spreading, efficiency-enhancing features of the FIGS. 2-8 embodiment and so gains all the listed advantages accruing therefrom.

Figure 15:
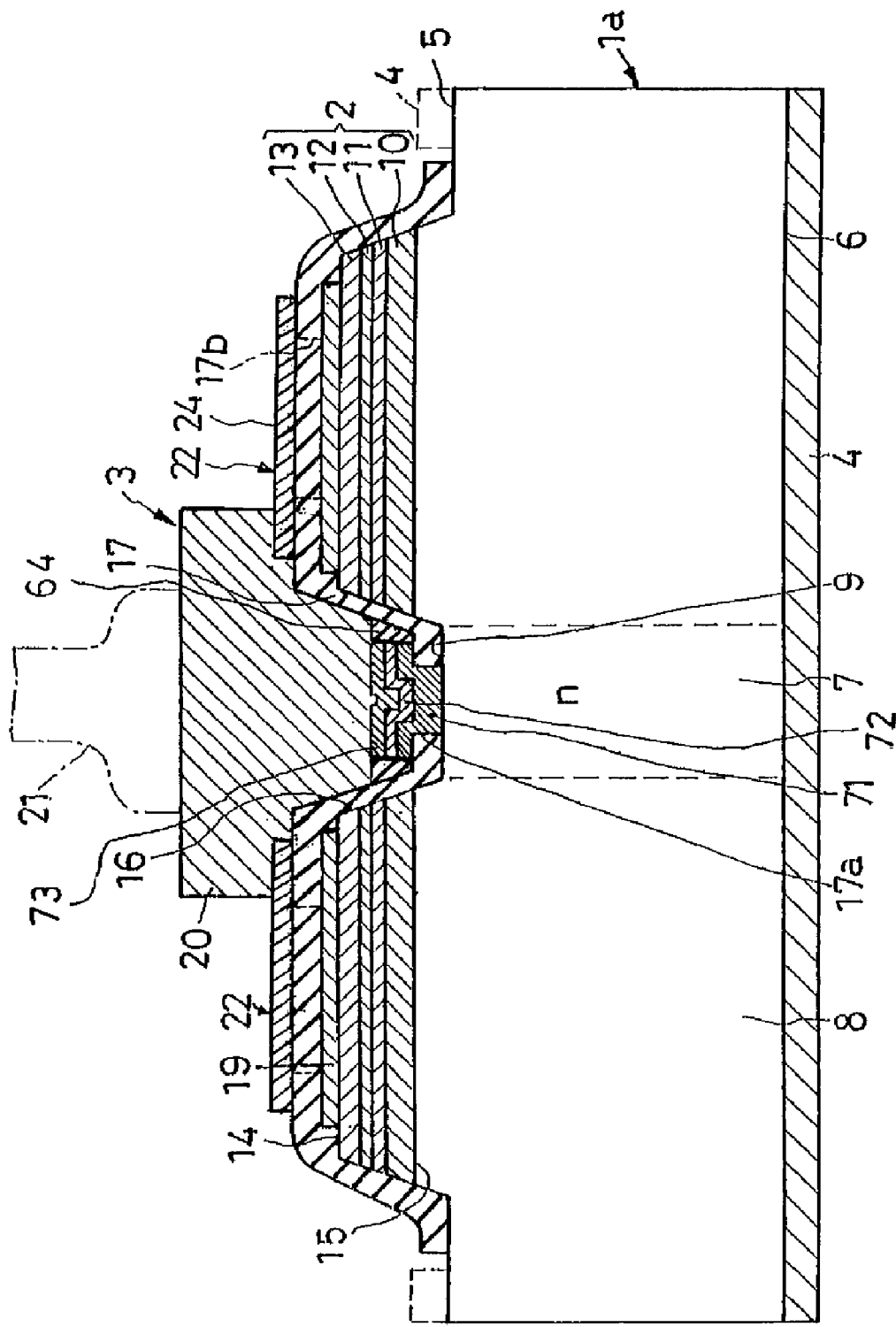
FIG. 15 is also an illustration similar to FIG. 3 but showing a further preferred form of overvoltage-protected, high-efficiency LED according to the invention.

Embodiment of FIG. 15

This embodiment is similar in construction to that of FIGS. 2-8 except that the p-type substrate 1 is replaced by an n-type one $1_a$, and the Schottky electrode 18 by a thin-film three-layer diode comprising an n-type first semiconductor film 71, p-type second semiconductor film 72, and n-type third semiconductor film 73.

The n-type first semiconductor film 71, which is in ohmic contact with the n-type substrate $1_a$, is made from the same material and by the same method as the n-type semiconductor film $40_a$ of the FIG. 13 embodiment. Overlying this first film, the p-type second semiconductor film 72 is made from the same material and by the same method as the p-type semiconductor film $41_a$ of the FIG. 14 embodiment. The n-type third semiconductor film 73 on the second film 72 is made from the same material and by the same method as the n-type semiconductor film $40_a$ of the FIG. 13 embodiment. This third film 73 is in ohmic contact with the bonding pad 20. Each side of the n-type first semiconductor film 71, the p-type second semiconductor film 72, and the n-type third semiconductor film 73 is covered with an insulator 64. The thin-film three-layer diode is disposed between the bonding pad 20 and the bottom surface 6 of the substrate 1.

The thin-film three-layer diode configured as above functions just like the npn diode of the FIG. 10 embodiment. This embodiment is also equipped with all the noted current-spreading, efficiency-enhancing features of the FIGS. 2-8 embodiment and so gains all the listed advantages accruing therefrom.

Figure 16:
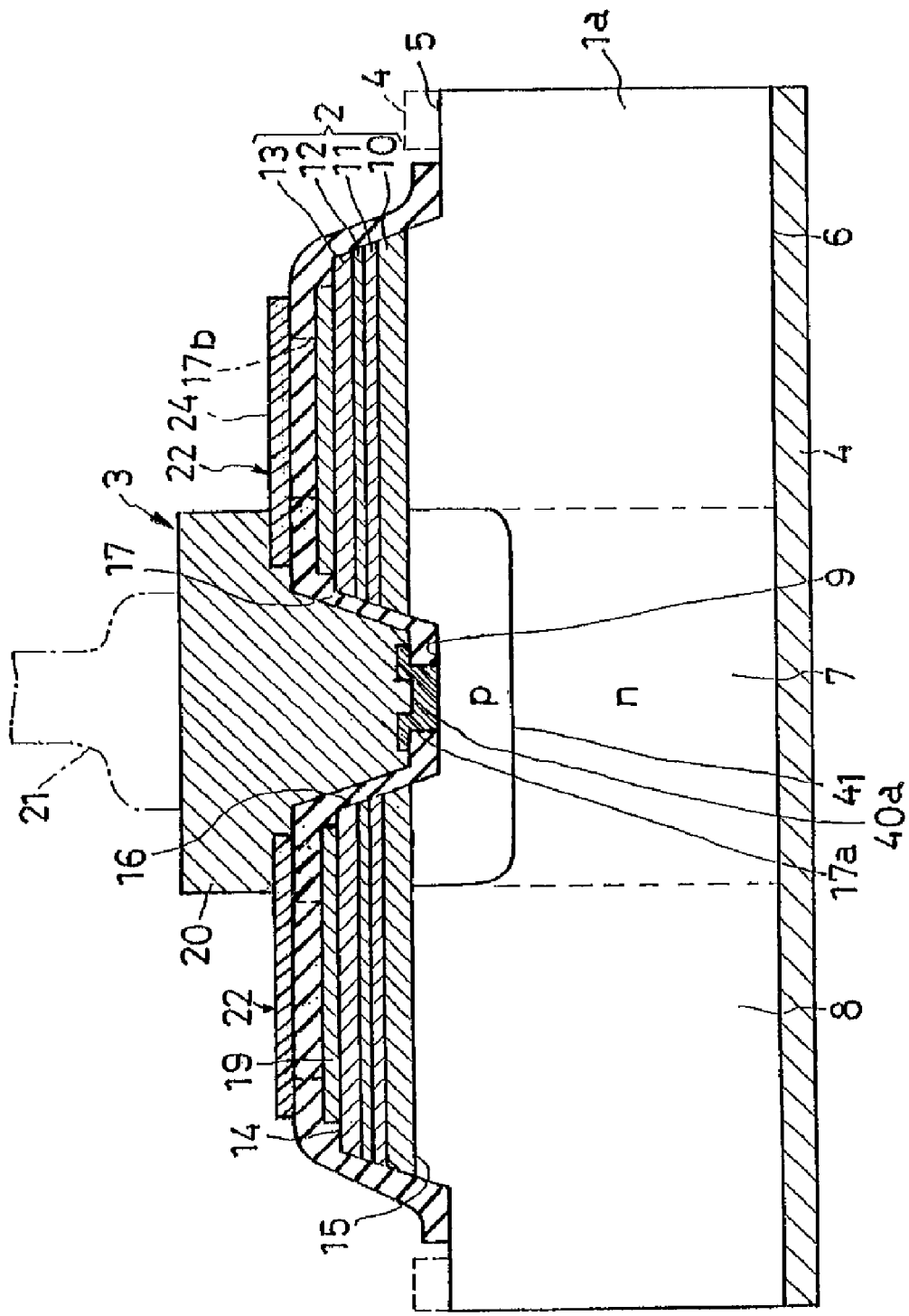
FIG. 16 is also an illustration similar to FIG. 3 but showing a further preferred form of overvoltage-protected, high-efficiency LED according to the invention.

Embodiment of FIG. 16

This embodiment is similar to that of FIG. 10 except that the n-type semiconductor region 40 of the latter is absent and that there is provided instead an n-type semiconductor film $40_a$ between the remaining p-type region 41 of the n-type substrate $1_a$ and the bonding pad 20. Made from the same material and by the same method as that designated by the same reference characters in FIG. 13, the n-type film $40_a$ creates a pn junction with the p-type substrate region 41 and makes ohmic contact with the bonding pad 20.

Thus is an npn diode constituted of the n-type substrate $1_a$, p-type substrate region 41, and n-type film $40_a$. This npn diode provides the same overvoltage-protecting function as does that of FIG. 10. This embodiment is also equipped with all the noted current-spreading, efficiency-enhancing features of the FIGS. 2-8 embodiment and so gains all the listed advantages accruing therefrom.

Figure 17:
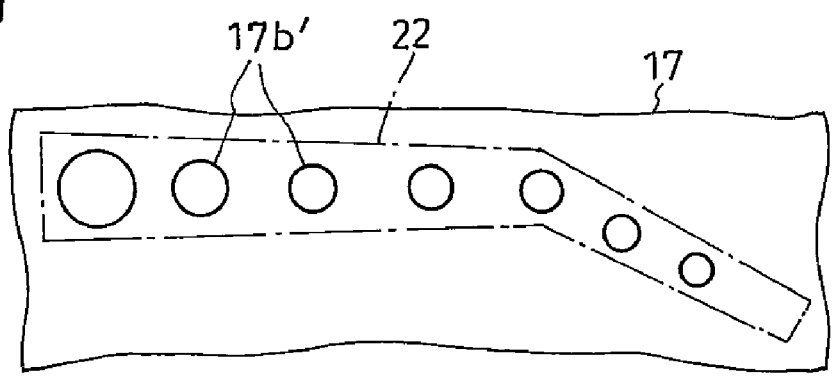
FIG. 17 is also an illustration similar to FIG. 3 but showing a further preferred form of overvoltage-protected, high-efficiency LED according to the invention.

Embodiment of FIG. 17

The transparent overlay 17 of the overvoltage-protected LED according to the invention need not necessarily be slitted as at $17_b$ in FIG. 5 to permit the overlying connector strips 22 to extend therethrough into electrical contact with the underlying current-spreading film 19. In FIG. 17 is shown each such slit in the transparent overlay 17 as being broken up into a series of discrete perforations $17_b'$. It is understood that each associated connector strip 22 has a series of bosses, instead of the continuous rib of the foregoing embodiments, on its underside which are received one in each perforation $17_b'$ in the transparent overlay 17.

Preferably, and as shown, each series of perforations $17_b'$ and therefore the bosses on each connector strip 22 incrementally increase in diameter as they go father away from the bonding pad which is not shown here. Such incrementally enlarged perforations and connector strip bosses are conducive to a more uniform current distribution throughout the light-generating semiconductor region. Also, the connector strips 22 are not to break easily as they are themselves unbent and have only the bosses received in the perforations $17_b'$. Consequently, this embodiment offers the same benefits as does that of FIGS. 2-8.

Figure 18:
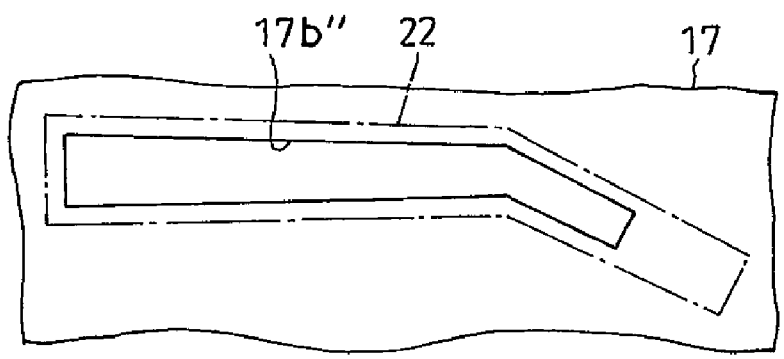
FIG. 18 is also an illustration similar to FIG. 3 but showing a further preferred form of overvoltage-protected, high-efficiency LED according to the invention.

Embodiment of FIG. 18

The slits $17_b$ of the FIGS. 2-8 embodiment may each grow wider as they go farther away from the bonding pad. FIG. 18 shows one of such gradually widening slits at $17_b''$. It is understood that the connector strips have ribs on their underside which are shaped in conformity with these slits $17_b''$ as they are closely received therein. This embodiment is just as effective as that of FIG. 17 to obtain a more uniform current distribution throughout the light-generating semiconductor region.

Figure 19:
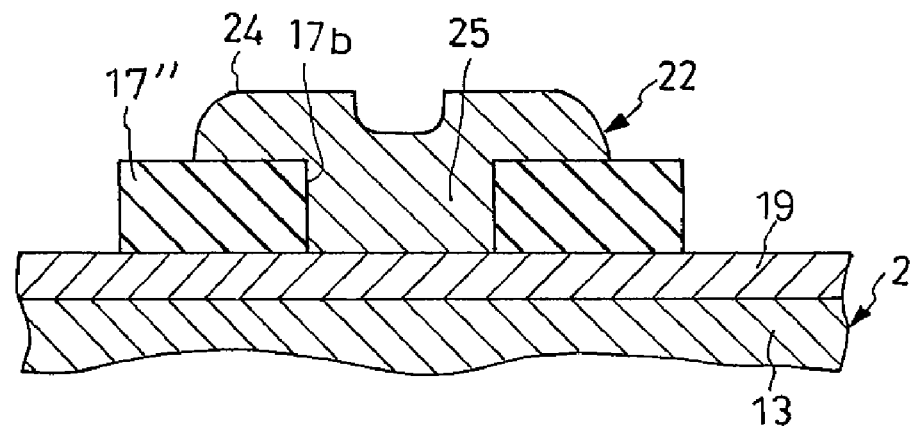
FIG. 19 is also an illustration similar to FIG. 3 but showing a still further preferred form of overvoltage-protected, high-efficiency LED according to the invention.

Embodiment of FIG. 19

The transparent overlay 17 of the FIGS. 2-8 embodiment is itself modifiable as indicated at 17''' in FIG. 19. The modified transparent overlay has a set of spokes 17''' extending radially outwardly from a hub which, like the central part of the transparent overlay 17 best shown in FIGS. 3 and 4, is placed between light-generating semiconductor region 2 and bonding pad 22. Each spoke 17''' has formed therein the slit $17_b$ (or perforations $17_b'$ of FIG. 17 or gradually widening slit $17_b''$ of FIG. 18) to permit the overlying connector strip 22 to extend therethrough into electric contact with the current-spreading film 19. Covering only parts of the current-spreading film 19, the hub-and-spoke transparent overlay is less capable of protecting the current-spreading film 19 than is the transparent overlay 17 of the first disclosed embodiment but more conducive to improvement of efficiency in light emission.

Possible Modifications

Notwithstanding the foregoing detailed disclosure it is not desired that the present invention be limited by the exact showings of the drawings or the description thereof. The following is a brief list of possible modifications, alterations or adaptations of the illustrated representative overvoltage-protected LEDs which are all believed to fall within the purview of the claims annexed hereto:

1. The radial slits $17_b$, FIG. 5, in the transparent overlay 17 could be reticulated by providing additional slits crossing the radial slits. The connector strips 22, FIG. 2, might then be correspondingly modified to include cross-strips received in the cross-slits into electric contact with the current-spreading film 19.

2. The radial connector strips 22 could all be joined via an annular hub placed under the bonding pad 20.

3. The substrate 1 or $1_a$ could be made from polycrystalline, instead of monocrystalline, silicon, or from silicon carbide or other silicon compounds, or from III-V compound semiconductors. Also, the constituent layers 10,11,12 and 13 of the light-generating semiconductor region 2 may be made from III-V compound semiconductors other than $Al_xM_yGa_{1-x-y}N$, $Al_aM_bGa_{1-a-b}N$ and $Al_xIn_yGa_{1-x-y}N$, such as AlP, GaP, AlInP, GaInP, AlGaP, AlGaAs, GaAs, AlAs, InAs, InP and GaAsP, or from II-VI compound semiconductors, or from other compound semiconductors.

4. The substrate 1 could be metal made in the embodiments of FIGS. 11, 12, 14 and 15.

5. The indicated conductivity types of the various parts of the various overvoltage-protected LEDs are all reversible.

7. The light-generating semiconductor region 2 could be provided with an additional current-spreading layer and or dedicated contact layer.

8. The overvoltage-protecting ceramic varistor 60, FIG. 12, is replaceable by a varistor chip such as that of a silicon varistor, constant-voltage diode, rectifying diode, or triple layer diode.

9. Conductors of various shapes or forms other than the wire 21 may be joined to the bonding pad 20.

10. The light-generating semiconductor region 2 could be bonded under heat and pressure to the silicon substrate 1 or $1_a$ or metal-made substrate instead of being grown in vapor phase thereon.

11. A layer of highly reflective material could be provided for redirecting toward the light-emitting surface of the LED the light that has been radiated toward the substrate from the light-generating semiconductor region.

12. Instead of creating the tapering cavity 16, FIGS. 3 and 4, in the laminated semiconductor layers 10-13 and fabricating the Schottky electrode 18 therein, those parts of these semiconductor layers which are shown etched away in these figures for creating the tapering cavity could be left unetched and, instead, electrically isolated from the light-generating semiconductor region 2. An overvoltage protector such as a Schottky barrier diode might then be formed by utilizing some of the isolated semiconductor layers 10-13 instead of the Schottky electrode 18.

What is claimed is:

1. A light-emitting semiconductor device comprising:
    (a) a substrate of electroconductive material having a first and a second opposite major surface;
    (b) a light-generating semiconductor region formed on the first major surface of the substrate and comprising a plurality of semiconductor layers for generating light, the light-generating semiconductor region having a first major surface from which the light is emitted, a second major surface held against the first major surface of the substrate, and a cavity extending therethrough between the first and the second major surface thereof;
    (c) a bonding pad covering a part of the first major surface of the light-generating semiconductor region and the cavity of the light-generating semiconductor region;
    (d) a substrate electrode on the substrate;
    (e) an overvoltage protector disposed between the bonding pad and the second major surface of the substrate and electrically connected to both of the bonding pad and the substrate electrode;
    (f) a current-spreading film of electrically conducting, optically transparent material on the first major surface of the light-generating semiconductor region;
    (g) a transparent overlay of electrically insulating material overlying the current-spreading film and partly placed between the bonding pad and the first major surface of the light-generating semiconductor region, the transparent overlay having a plurality of slits; and (h) connector means overlying the transparent overlay and electrically coupled to the bonding pad, the connector means being less in resistivity than the current-spreading film and being formed to include parts received in the slits in the transparent overlay into contact with the current-spreading film for electrically connecting the bonding pad to the current-spreading film, wherein the connector means comprises a plurality of connector strips each having one end in electrical contact with the bonding pad and all extending substantially radially therefrom over the transparent overlay, each connector strip being received in part in one slit in the transparent overlay into electrical contact with the current-spreading film.

2. A light-emitting semiconductor device as defined in claim 1, wherein each connector strip of the connector means is T-shaped in cross section, comprising a strip section overlying the transparent overlay and a rib section depending from the strip section and received in one slit in the transparent overlay into contact with the current-spreading film.

3. A light-emitting semiconductor device as defined in claim 2, wherein the rib section of each connector strip of the connector means terminates short of at least one extremity of the connector strip, leaving an extra length of the strip section which is interposed between the bonding pad and the transparent overlay, each slit in the transparent overlay being of the same length as the rib section of each connector strip.

4. A light-emitting semiconductor device as defined in claim 1, wherein each slit in the transparent overlay is broken up into a series of perforations.

5. A light-emitting semiconductor device as defined in claim 4, wherein each series of perforations in the transparent overlay progressively increase in size as they go farther away from the bonding pad.

6. A light-emitting semiconductor device as defined in claim 1, wherein each slit in the transparent overlay grows wider as it goes farther away from the bonding pad.

7. A light-emitting semiconductor device as defined in claim 1, wherein the transparent overlay is higher in transparency than the current-spreading film with respect to the light generated by the light-generating semiconductor region.

8. A light-emitting semiconductor device as defined in claim 1, wherein the substrate is made from a semiconductor, and wherein the overvoltage protector comprises a Schottky electrode placed between the bonding pad and the substrate.

9. A light-emitting semiconductor device as defined in claim 1, wherein the substrate is made from a semiconductor of a first conductivity type, and wherein the overvoltage protector is a pn-junction diode having a pn junction formed in the substrate by creating a semiconductor region of a second conductivity type, opposite to the first conductivity type, in the substrate, the pn-junction diode being electrically coupled to the bonding pad and the substrate electrode.

10. A light-emitting semiconductor device as defined in claim 1, wherein the substrate is made from a semiconductor of a first conductivity type, and wherein the overvoltage protector is a bidirectional trigger diode comprising a first semiconductor region of a second conductivity type, opposite to the first, formed in the substrate in register with the bonding pad, and a second semiconductor region of the first conductivity type formed in the first semiconductor region.

11. A light-emitting semiconductor device as defined in claim 1, wherein the overvoltage protector is a thick-film capacitor having a thick-film dielectric layer received in the cavity in the light-generating semiconductor region and interposed between the substrate and the bonding pad.

12. A light-emitting semiconductor device as defined in claim 1, wherein the overvoltage protector is a varistor.

13. A light-emitting semiconductor device as defined in claim 1, wherein the substrate is made from a semiconductor of a first conductivity type, and wherein the overvoltage protector is a pn-junction diode formed comprising a semiconductor film of a second conductivity type, opposite to the first, which is interposed between the substrate and the bonding pad.

14. A light-emitting semiconductor device as defined in claim 1, wherein the overvoltage protector is a pn-junction diode comprising two semiconductor films of opposite conductivity types interposed between the substrate and the bonding pad.

15. A light-emitting semiconductor device as defined in claim 1, wherein the substrate is made from a semiconductor of a first conductivity type, and wherein the overvoltage protector is a thin-film three-layer diode comprising a first semiconductor film of the first conductivity type in contact with the substrate, a second semiconductor film of a second conductivity type, opposite to the first, in contact with the first semiconductor film, and a third semiconductor film of the first conductivity type in contact with the second semiconductor film and with the bonding pad.

16. A light-emitting semiconductor device as defined in claim 1, wherein the substrate is made from a semiconductor of a first conductivity type, and wherein the overvoltage protector is an npn diode comprising a semiconductor region of a second conductivity type, opposite to the first, formed in the substrate, and a semiconductor film of the first conductivity type between the semiconductor region and the bonding pad.

* * * * *